(12) United States Patent
Purser et al.

(10) Patent No.: US 10,555,615 B2
(45) Date of Patent: Feb. 11, 2020

(54) CALIBRATION OF DETECTION FEATURES FOR AUTOMATED FURNITURE

(71) Applicant: L&P Property Management Company, South Gate, CA (US)

(72) Inventors: David Purser, Carthage, MO (US); Caleb Browning, Carthage, MO (US); Avinash Madadi, Carl Junction, MO (US); William Robert Rohr, Joplin, MO (US); Ryan Edward Chacon, Carthage, MO (US)

(73) Assignee: L&P Property Management Company, South Gate, CA (US)

( * ) Notice: Subject to any disclaimer, the term of this patent is extended or adjusted under 35 U.S.C. 154(b) by 11 days.

(21) Appl. No.: 16/046,134

(22) Filed: Jul. 26, 2018

(65) Prior Publication Data

US 2018/0325270 A1    Nov. 15, 2018

Related U.S. Application Data

(63) Continuation-in-part of application No. 14/810,355, filed on Jul. 27, 2015, now Pat. No. 10,048,662, (Continued)

(51) Int. Cl.
*A47C 20/04* (2006.01)
*G01R 27/26* (2006.01)
(Continued)

(52) U.S. Cl.
CPC ............ *A47C 20/041* (2013.01); *G01D 5/24* (2013.01); *G01R 27/2605* (2013.01); *H03K 17/955* (2013.01)

(58) Field of Classification Search
None
See application file for complete search history.

(56) References Cited

U.S. PATENT DOCUMENTS 3,372,319 A    3/1968 Rhodes
3,971,371 A    7/1976 Bloom
(Continued)

FOREIGN PATENT DOCUMENTS

DE    102007018694 A1    11/2008
EP    1275328 A1    1/2003
(Continued)

OTHER PUBLICATIONS

Non-Final Office Action dated Oct. 25, 2018 in U.S. Appl. No. 15/339,927, 8 pages.
(Continued)

*Primary Examiner* — Paul B Yanchus, III
(74) *Attorney, Agent, or Firm* — Shook, Hardy & Bacon L.L.P.

(57) ABSTRACT

A system and method for calibrating one or more sensing features for a furniture item detection is provided. More particularly, embodiments relate to determining a first noise state associated with an environment of the furniture item based on a first measured noise received from one or more sensors associated with the furniture item. A first baseline noise level for the furniture item can be generated based on filtering the first noise state associated with the environment of the furniture item. A second noise state associated with the environment of the furniture item can be determined based on a second measured noise received from the one or more sensors associated with the furniture item. A second baseline noise level for the furniture item can be generated based on filtering the second noise state associated with the environment of the furniture item. The first baseline noise level can then be adjusted to the second baseline noise level.

20 Claims, 23 Drawing Sheets

Related U.S. Application Data which is a continuation-in-part of application No. 13/854,720, filed on Apr. 1, 2013, now Pat. No. 9,089,223, which is a continuation-in-part of application No. 13/749,120, filed on Jan. 24, 2013, now Pat. No. 9,528,812, which is a continuation-in-part of application No. 13/346,386, filed on Jan. 9, 2012, now Pat. No. 9,337,831.

(51) Int. Cl.
  *G01D 5/24* (2006.01)
  *H03K 17/955* (2006.01)

(56) References Cited

U.S. PATENT DOCUMENTS

| | | | |
|---|---|---|---|
| 3,991,746 | A | 11/1976 | Hanna |
| 5,230,113 | A * | 7/1993 | Foster .................. A61G 5/14 5/604 |
| 5,235,319 | A | 8/1993 | Hill et al. |
| 5,260,666 | A | 11/1993 | Dishman et al. |
| 5,481,769 | A | 1/1996 | Schneider |
| 6,025,782 | A | 2/2000 | Newham |
| 6,067,019 | A | 5/2000 | Scott |
| 6,283,504 | B1 | 9/2001 | Stanley et al. |
| 6,297,738 | B1 | 10/2001 | Newham |
| 6,768,420 | B2 | 7/2004 | McCarthy et al. |
| 6,946,853 | B2 | 9/2005 | Gifford et al. |
| 7,135,983 | B2 | 11/2006 | Filippov et al. |
| 7,190,277 | B2 | 3/2007 | Fultz et al. |
| 8,143,567 | B2 | 3/2012 | Williams et al. |
| 8,344,665 | B2 | 1/2013 | Verfuerth et al. |
| 8,397,324 | B2 | 3/2013 | Hayes et al. |
| 8,427,450 | B2 | 4/2013 | Lin |
| 8,461,610 | B2 | 6/2013 | Ito et al. |
| 8,796,610 | B2 | 8/2014 | Williams et al. |
| 8,957,689 | B2 | 2/2015 | Virnich et al. |
| 9,089,223 | B2 | 7/2015 | Chacon et al. |
| 9,131,783 | B2 | 9/2015 | Chacon et al. |
| 9,337,831 | B2 | 5/2016 | Rohr et al. |
| 9,351,381 | B2 | 5/2016 | Verfuerth et al. |
| 9,482,707 | B2 | 11/2016 | Chacon et al. |
| 9,488,746 | B2 | 11/2016 | Chacon et al. |
| 9,504,133 | B2 | 11/2016 | Verfuerth et al. |
| 9,615,433 | B1 | 4/2017 | O'Neil |
| 10,048,662 | B2 | 8/2018 | Chacon et al. |
| 2002/0070866 | A1 | 6/2002 | Newham |
| 2003/0011225 | A1 | 1/2003 | Barcesat |
| 2003/0222588 | A1 | 12/2003 | Myron et al. |
| 2005/0088264 | A1 | 4/2005 | Iwasaki |
| 2005/0231379 | A1 | 10/2005 | Sprecher et al. |
| 2005/0236906 | A1 | 10/2005 | Morgan et al. |
| 2006/0164254 | A1 | 7/2006 | Kamizono et al. |
| 2006/0196281 | A1 | 9/2006 | Koors |
| 2006/0261769 | A1 | 11/2006 | Rees |
| 2007/0040676 | A1 | 2/2007 | Bandringa et al. |
| 2008/0071200 | A1 | 3/2008 | Rawls-Meehan |
| 2008/0146359 | A1 | 6/2008 | Godiska |
| 2008/0186034 | A1 | 8/2008 | Scheckenbach et al. |
| 2008/0262657 | A1 | 10/2008 | Howell et al. |
| 2009/0072604 | A1 | 3/2009 | Browne et al. |
| 2009/0119841 | A1 | 5/2009 | Takashima |
| 2009/0211818 | A1 | 8/2009 | Kondo et al. |
| 2009/0243517 | A1 | 10/2009 | Verfuerth et al. |
| 2010/0039269 | A1 | 2/2010 | Newham |
| 2010/0096899 | A1 | 4/2010 | Kato et al. |
| 2010/0294915 | A1 | 11/2010 | Williams et al. |
| 2011/0068928 | A1 | 3/2011 | Riley et al. |
| 2011/0083271 | A1 | 4/2011 | Bhai |
| 2011/0163765 | A1 | 7/2011 | Gray et al. |
| 2011/0209287 | A1 | 9/2011 | Call et al. |
| 2011/0221459 | A1 | 9/2011 | Uno et al. |
| 2011/0279276 | A1 | 11/2011 | Newham |
| 2012/0025991 | A1 | 2/2012 | O'Keefe et al. |
| 2012/0151678 | A1 | 6/2012 | Richards |
| 2012/0169242 | A1 | 7/2012 | Olson |
| 2012/0200524 | A1 | 8/2012 | Vallis et al. |
| 2012/0211296 | A1 | 8/2012 | Morishita et al. |
| 2012/0313588 | A1 | 12/2012 | Carberry et al. |
| 2013/0033183 | A1 | 2/2013 | Verfuerth et al. |
| 2013/0106164 | A1 | 5/2013 | Chacon et al. |
| 2013/0131882 | A1 | 5/2013 | Verfuerth et al. |
| 2013/0174343 | A1 | 7/2013 | Chacon et al. |
| 2013/0176040 | A1 | 7/2013 | Rohr et al. |
| 2013/0247302 | A1 | 9/2013 | Chacon et al. |
| 2013/0271011 | A1 | 10/2013 | Williams et al. |
| 2014/0198059 | A1 * | 7/2014 | Gu .................. G06F 3/041 345/173 |
| 2014/0246892 | A1 | 9/2014 | Samain et al. |
| 2014/0302795 | A1 | 10/2014 | Chacon et al. |
| 2015/0137833 | A1 | 5/2015 | Chacon et al. |
| 2015/0137835 | A1 | 5/2015 | Chacon et al. |
| 2015/0327687 | A1 | 11/2015 | Chacon et al. |
| 2016/0084487 | A1 | 3/2016 | Chacon et al. |
| 2016/0312986 | A1 | 10/2016 | Maros et al. |
| 2016/0345746 | A1 | 12/2016 | Myers et al. |
| 2017/0042340 | A1 | 2/2017 | Chacon et al. |
| 2017/0071050 | A1 | 3/2017 | Potts et al. |
| 2017/0253330 | A1 | 9/2017 | Saigh et al. |

FOREIGN PATENT DOCUMENTS

| | | |
|---|---|---|
| GB | 2368176 A | 4/2002 |
| GB | 2491074 A | 11/2012 |
| SE | 519289 C2 | 2/2003 |
| WO | 9944179 A1 | 9/1999 |
| WO | 20020211585 A1 | 2/2002 |
| WO | 200247942 A2 | 6/2002 |

OTHER PUBLICATIONS

Final Office Action dated Jan. 17, 2019 in U.S. Appl. No. 15/149,684, 7 pages.
Notice of Allowance dated Feb. 13, 2019 in U.S. Appl. No. 15/339,927, 9 pages.
Notice of Allowance dated Mar. 1, 2019 in U.S. Appl. No. 15/149,684, 6 pages.
Examination Report dated Mar. 13, 2019 in Australian Patent Application No. 2016211444, 5 pages.
Acceptance of Application to Amend a Complete Specification dated Mar. 28, 2019 in South African Patent Application No. 2018/04461, 1 page.
Office Action dated Apr. 15, 2019 in Canadian Patent Application No. 3,011,579, 3 pages.
Search Report and Written Opinion dated Jul. 26, 2018 in European Patent Application No. 16744103.9, 7 pages.
International Preliminary Report on Patentability dated Aug. 23, 2018 in International Patent Application No. PCT/US2017/012949, 8 pages.
Non-Final Office Action dated Aug. 31, 2018 in U.S. Appl. No. 15/149,684, 13 pages.
Notice of Allowance dated Sep. 18, 2018 in U.S. Appl. No. 14/955,859, 16 pages.
Notice of Allowance dated Sep. 18, 2018 in U.S. Appl. No. 15/018,862, 9 pages.

* cited by examiner

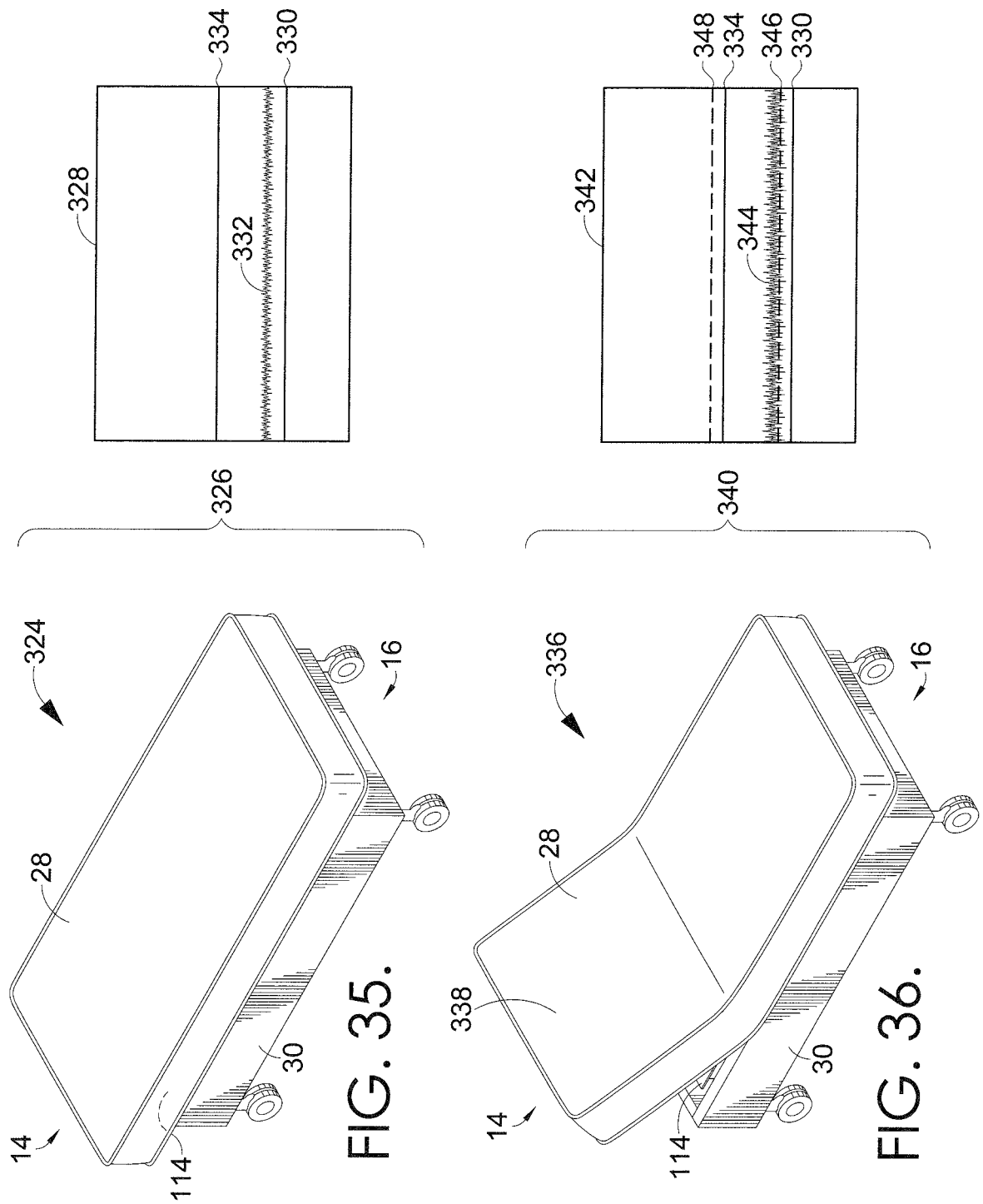

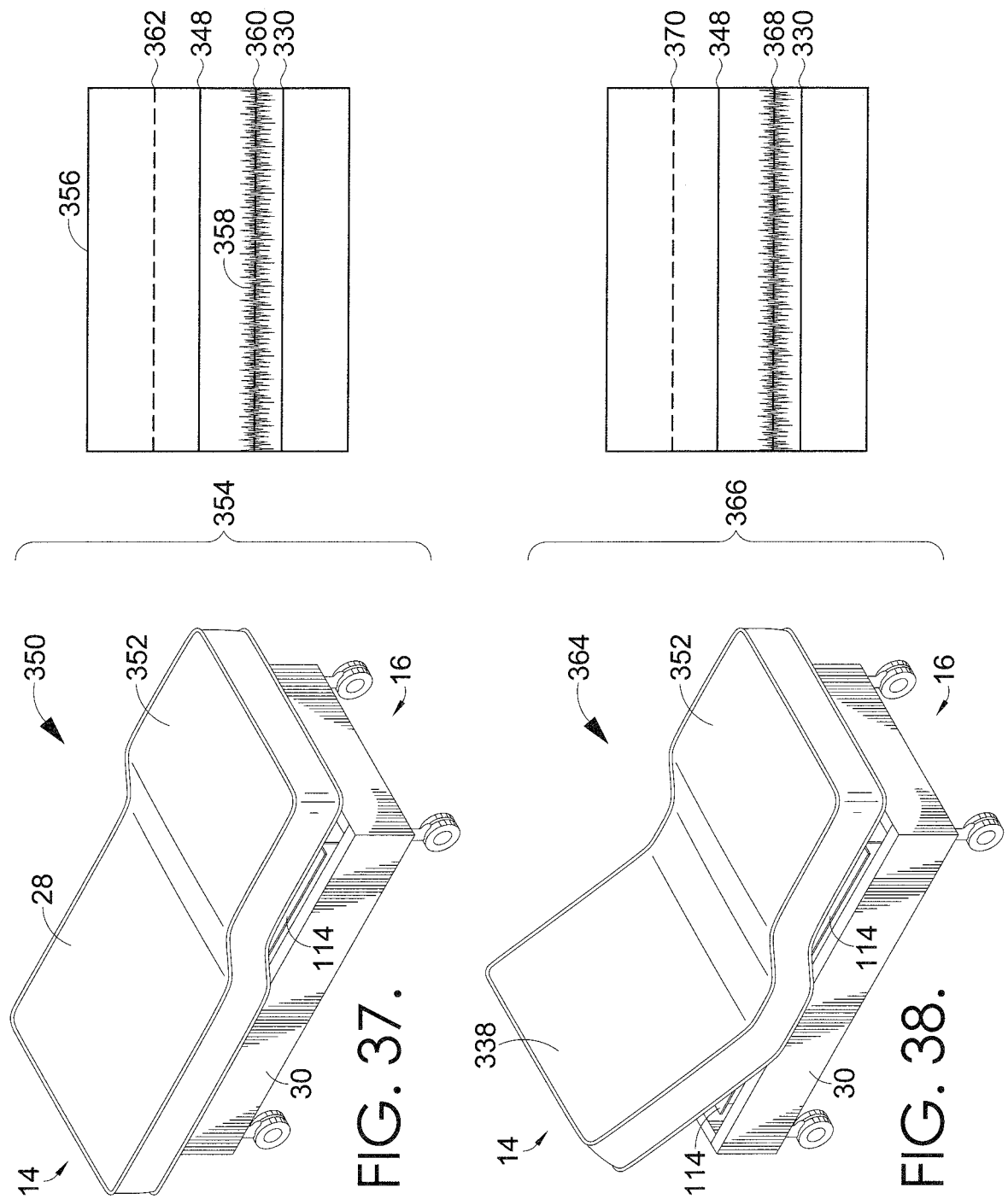

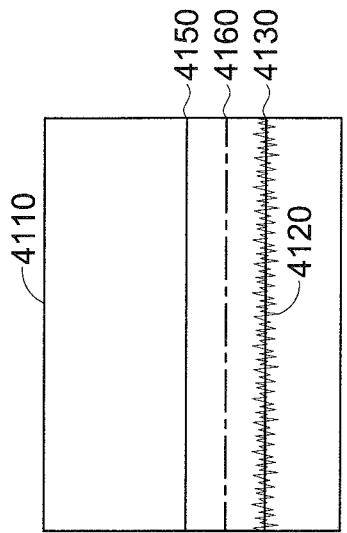
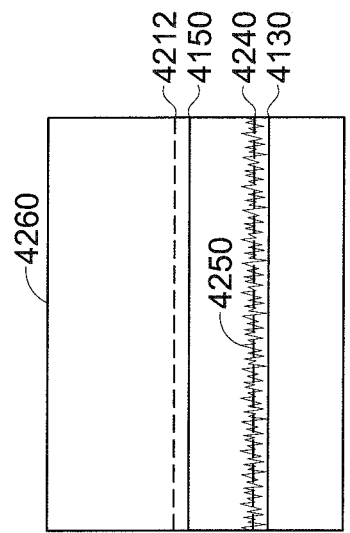
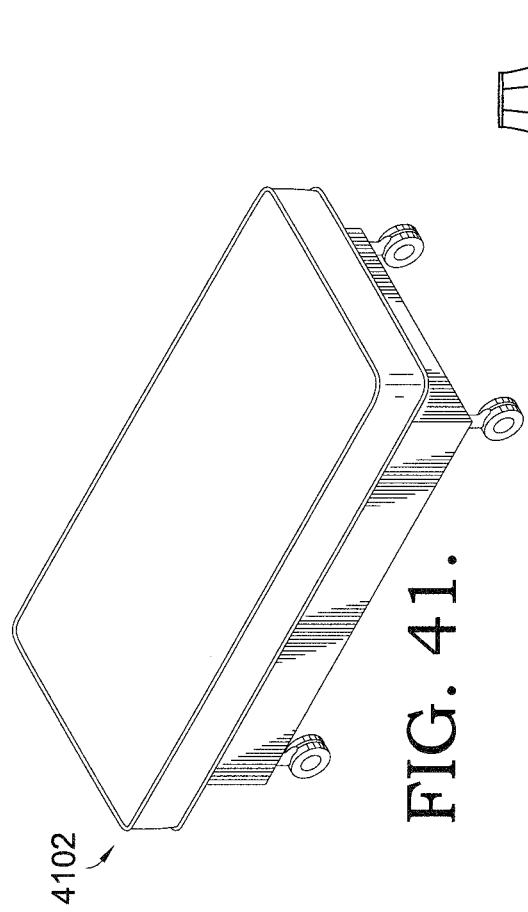
FIG. 41.
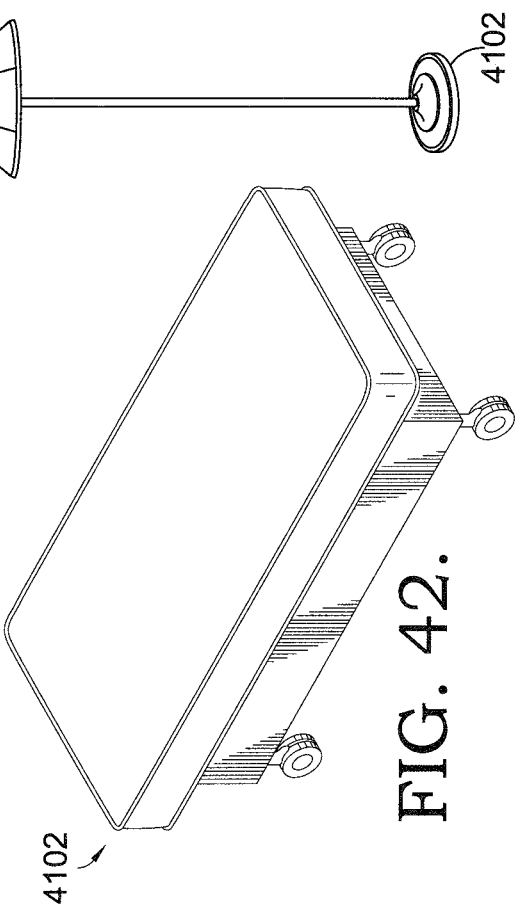
FIG. 42.

CALIBRATION OF DETECTION FEATURES FOR AUTOMATED FURNITURE

CROSS-REFERENCE TO RELATED APPLICATIONS

This application is a continuation-in-part of U.S. Nonprovisional patent application Ser. No. 14/810,355, filed Jul. 27, 2015, entitled "Characterization And Calibration For Automated Furniture," which is a continuation-in-part of U.S. Nonprovisional patent application Ser. No. 13/854,720, filed Apr. 1, 2013, entitled "Occupancy Detection for Furniture," now U.S. Pat. No. 9,089,223, which is a continuation-in-part of U.S. Nonprovisional patent application Ser. No. 13/749,120, filed Jan. 24, 2013, entitled "Capacitive Wire Sensing for Furniture," now U.S. Pat. No. 9,528,812, which is a continuation-in-part of U.S. Nonprovisional patent application Ser. No. 13/346,386, filed Jan. 9, 2012, entitled "Capacitive Wire Sensing for Furniture," now U.S. Pat. No. 9,337,831, the entire contents of each of which are hereby incorporated by reference.

STATEMENT REGARDING FEDERALLY SPONSORED RESEARCH OR DEVELOPMENT

Not applicable.

TECHNICAL FIELD

The present invention generally relates to occupancy-detecting technology incorporated into furniture. More particularly, the invention relates to coordinating capacitive technology and controller features for automated furniture items, such as a bed, chair, or other automated furniture item, for detecting the presence of an occupant and synchronizing related features and/or accessories.

BACKGROUND OF THE INVENTION

Traditional occupancy-detection technology does not automatically pair to automated bedding system controllers and accessories. As such, incorporating occupancy detection technology into existing automated bedding systems may be challenging. Further, without an integrated occupancy-detection system, a consumer may not have access to control particular features and/or accessories with the automated bedding system, particularly those features/accessories that are primarily controlled through manual manipulation or programming. An additional need exists for an integrated occupancy-detection system that accurately monitors an automated furniture environment in coordination with one or more positions of the furniture item.

Accordingly, a need exists for a reliable occupancy-detection technology for use with furniture, such as an automated bedding system, which addresses the foregoing and other problems.

BRIEF SUMMARY OF THE INVENTION

The present invention generally relates to a system and method for occupancy detection that incorporates a capacitive component into furniture items, including automated bedding systems and other automated furniture environments. It should be understood that the invention contemplates incorporating an automatic occupancy-detection component and/or system into a variety of furniture items, both bedding and otherwise, and that the invention is not limited to the specific item for which occupancy detection is provided. Additionally, the present invention is described as detecting/sensing occupancy (e.g., the presence of a person or other being in or on the automated furniture item) using exemplary components such as a detection pad, a detection grid, a series of detection pads, a control cable, and/or a processor. Although a final determination of presence may be conducted using a processor and/or software associated with the claimed system/apparatus, reference to occupancy sensing and/or detection "by" the system/apparatus, or a determination thereof by the processor, is not meant to be limiting. For example, a conductive signal detected by a detection pad may be processed by software associated with a processor in a control enclosure, and such processing may result in a final determination of occupancy. In other words, a detection pad could be described as having "detected" occupancy, even though the detection determination was ultimately made in software associated with a processor.

In one embodiment, one or more capacitive detection pads are secured to a portion of a top and/or bottom surface of a platform of an adjustable furniture item, such as an adjustable bed. In another embodiment, a wire grid is coupled to a top and/or bottom surface of an adjustable platform, such as an adjustable bed platform. A series of interconnected, capacitive tape strips may also be coupled to a top and/or bottom surface of an adjustable furniture platform. In further embodiments, a detection pad may be incorporated into a topper material of a mattress, cushion, or other feature of an adjustable furniture item. In some embodiments, single occupant position may be detected using an array of multiple detection pads.

Exemplary embodiments of the invention include a control enclosure coupled to a capacitive component (such as a detection pad or other detection material) that is associated with a processor that receives presence-detecting data via the capacitive component. Software associated with the control enclosure and the capacitive component (e.g., detection pad) may then make a determination of occupancy of the automated furniture item, such as an adjustable bedding system. Based on a determination of occupancy, or lack thereof, a corresponding feature of the automated furniture system may be activated.

One illustrative embodiment of an adjustable bed includes a mattress support having a plurality of support panels, at least one of said support panels movable relative to the other ones of said support panels to thereby adjust the bed; a mattress resting on top of the mattress support, said mattress having a covering material disposed over at least a top surface of the mattress; at least one capacitive component coupled to the bed, wherein the at least one capacitive component is adapted to have a voltage based on proximity of an object to the at least one capacitive component, and further wherein the at least one capacitive component comprises at least one detection pad coupled to at least one of the plurality of support panels; and a processor coupled to the at least one capacitive component, the processor adapted to receive information provided by the at least one capacitive component and to determine that a change in voltage satisfies a threshold.

In another illustrative aspect, the present invention includes a method for detecting occupancy with respect to an item of furniture, the method comprising: receiving information provided by at least one detection pad coupled to the item of furniture, wherein the at least one detection pad comprises one or more of an aluminized Mylar®, an aluminum sheet, a metal screen, a wire grid, one or more strips of aluminum tape, and a metalized material or fabric associated with the item of furniture, wherein receiving information comprises receiving an indication that a sensor associated with the at least one detection pad was triggered, and further wherein the at least one detection pad is adapted to have a voltage based on proximity of an object to the at least one detection pad; and determining that a change in voltage satisfies a threshold, wherein determining that a change in voltage satisfies a threshold comprises: (1) monitoring a change in voltage detected by the at least one detection pad over a particular period of time; and (2) comparing the change in voltage over the period of time with the threshold.

According to a third illustrative aspect, the present invention includes a method for detecting presence with respect to an adjustable bed, the method comprising: receiving information provided by at least one detection pad coupled to an adjustable bed, wherein the at least one detection pad is adapted to have a voltage based on proximity of an object to the at least one detection pad, and further wherein the at least one detection pad comprises a conductive material; determining that a change in voltage satisfies a threshold amount; and based on determining that the threshold amount is satisfied, initiating a corresponding response.

According to a further aspect, embodiments include a non-transitory computer-readable storage medium including instructions that, when executed by a processor, cause the processor to: determine a first noise state associated with an environment of the furniture item based on a first measured noise received from one or more sensors associated with the furniture item; generate a first baseline noise level for the furniture item based on filtering the first noise state associated with the environment of the furniture item; determine a second noise state associated with the environment of the furniture item based on a second measured noise received from the one or more sensors associated with the furniture item; generate a second baseline noise level for the furniture item based on filtering the second noise state associated with the environment of the furniture item; and adjust the first baseline noise level to the second baseline noise level.

In another aspect, embodiments provide for a method for calibrating detection features associated with a furniture item comprising: determining a first noise state associated with an environment of the furniture item based a first measured noise received from one or more sensors associated with the furniture item; generating a first baseline noise level for the furniture item based on filtering the first noise state associated with the environment of the furniture item; determining a second noise state associated with the environment of the furniture item based on a second measured noise received from the one or more sensors associated with the furniture item; generating a second baseline noise level for the furniture item based on filtering the second noise state associated with the environment of the furniture item; and adjusting the first baseline noise level to the second baseline noise level.

In yet another aspect, embodiments provide for A system for calibrating detection features for a furniture item comprising: one or more processors; computer storage memory having computer-executable instructions stored thereon which, when executed by the one or more processors, perform operations comprising: determine a first noise state associated with an environment of the furniture item based on a first measured noise received from one or more sensors associated with the furniture item; generate a first baseline noise level for the furniture item based on filtering the first noise state of the environment of the furniture item via a first filtering scheme; generate a first threshold for a sensing feature based on the first baseline noise level; determine a second noise state associated with the environment of the furniture item based a second measured noise received from the one or more sensors associated with the furniture item; generate a second baseline noise level based on filtering the second noise state associated with the environment of the furniture item via a second filtering scheme; adjust the first baseline noise level to the second baseline noise level; and generate a second threshold for the sensing feature based on the second baseline noise level.

Additional objects, advantages, and novel features of the invention will be set forth in part in the description which follows, and in part will become apparent to those skilled in the art upon examination of the following, or may be learned by practice of the invention.

BRIEF DESCRIPTION OF SEVERAL VIEWS OF THE DRAWING

The present invention is described in detail below with reference to the attached drawing figures, wherein:

FIG. 35 is a perspective view of a position profile characterization for an automated furniture item in a first position, in accordance with embodiments of the invention;

FIG. 36 is a perspective view of a position profile characterization for an automated furniture item in a second position, in accordance with embodiments of the invention;

FIG. 37 is a perspective view of a position profile characterization for an automated furniture item in a third position, in accordance with embodiments of the invention;

FIG. 38 is a perspective view of a position profile characterization for an automated furniture item in a fourth position, in accordance with embodiments of the invention;

FIG. 41 is an exemplary system perspective view of a furniture item and a graphical depiction, in accordance with embodiments of the invention;

FIG. 42 is an exemplary system perspective view of a furniture item and a graphical depiction, in accordance with embodiments of the invention.

DETAILED DESCRIPTION OF THE INVENTION

Figure 1:
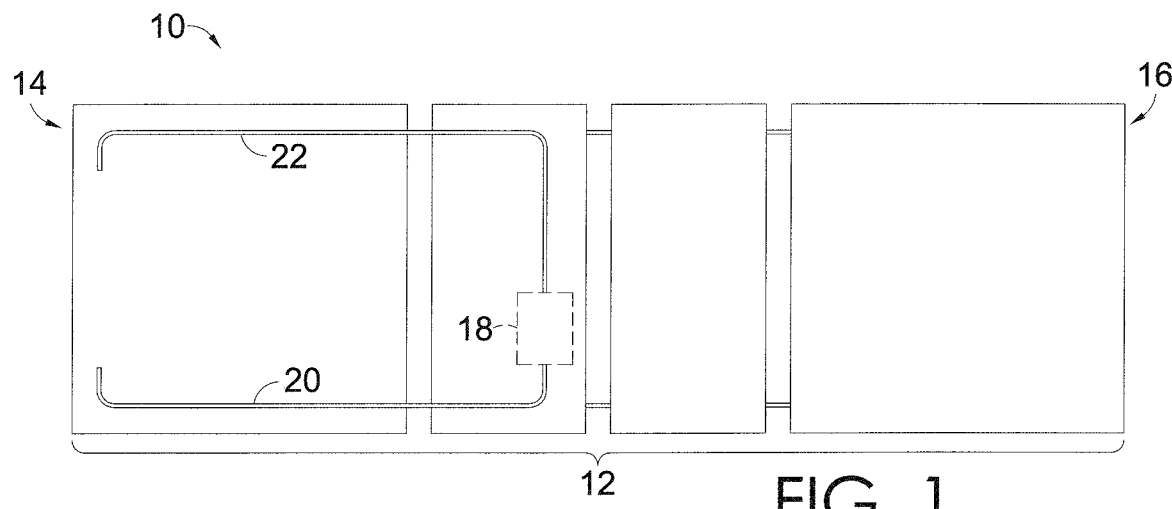
FIG. 1 is a top view of a capacitive wire coupled to the panels of an automated bed platform, in accordance with embodiments of the invention.

An embodiment of an automated bedding system 10 with capacitive wire sensing is seen in FIGS. 1-6. Referring first to FIG. 1, a top view of the platform of the automated bedding system 10 includes a plurality of panels 12 having a first end 14 and a second end 16, a control enclosure 18 (mounted below the panels 12), a first segment 20 of a capacitive wire, and a second segment 22 of a capacitive wire. In some embodiments, the first end 14 may be referred to as the "head" of the bed, while the second end 16 may be referred to as the "foot" of the bed.

When viewed from the top in FIG. 1, capacitive wiring is generally arranged near the first end 14 of the automated bedding system 10. A capacitive component, such as a capacitive wire, is adapted to have a voltage based on proximity of an object to the capacitive component. In some embodiments, the capacitive wire segments are standard conductive copper wires. The capacitance measured across such wires may be monitored by a processor that uses software to generate a determination of presence detection.

In one embodiment, the Microchip® brand capacitive sensor may be used to determine when presence is detected. As such, while presence detection relies on the juxtaposition of a person or body with respect to the capacitive wiring, a determination of the level of detection or the measurement of presence is conducted digitally, in software associated with the processor.

As shown in FIG. 1, the capacitive wiring first and second segments 20 and 22 are coupled to the control enclosure 18, which is mounted below the panels 12 of the bedding system 10. In some embodiments, first and second segments 20 and 22 are made from a single capacitive wire, while in other embodiments, two separate capacitive wire segments 20 and 22 are coupled to the control enclosure 18. As will be understood, additional capacitive components, such as capacitive wire segments, may be coupled to the control enclosure 18, and arranged on the top of the plurality of panels 12. For example, additional capacitive wires arranged perpendicular to each other may be coupled to the control enclosure 18. In further embodiments, first and second segments 20 and 22 are made from a capacitive material other than wire.

Capacitive wire segments 20 and 22 may be used to detect presence or absence of a person or other being on top of the automated bedding system 10. For example, as arranged near first end 14 of the automated bedding system 10, the torso of a person positioned on the top of the automated bedding system 10 may be detected by capacitive wire segments 20 and 22. In embodiments, capacitive wire segments 20 and 22 create a defined sensing area on the top half of the head of the bedding system 10, and are less susceptible to noise interference from articulation of the rest of the automated bedding system 10.

Figure 2:
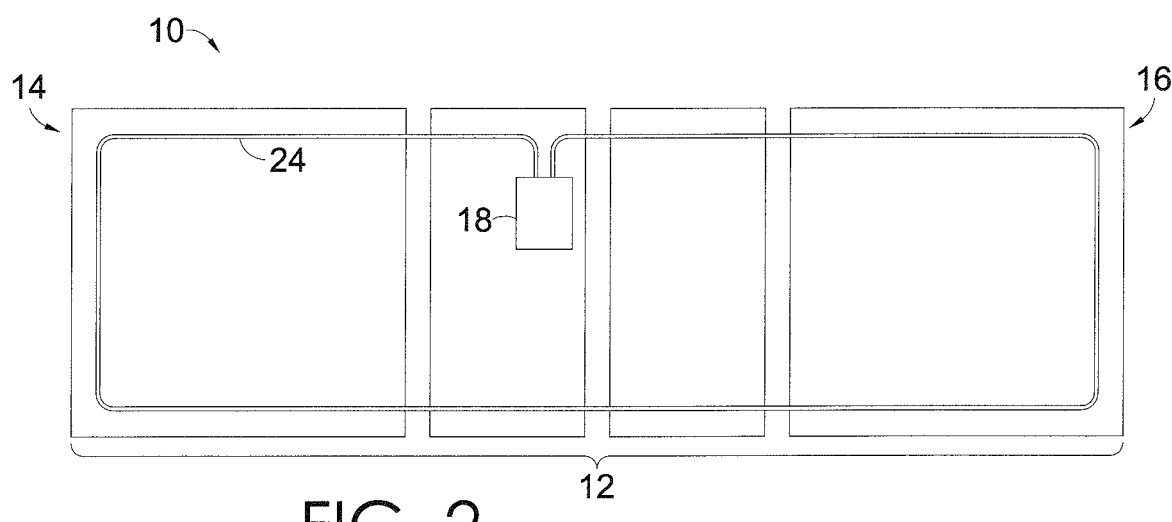
FIG. 2 is a bottom view of the automated bed platform of FIG. 1, with a capacitive wire and a control enclosure coupled to the panels, in accordance with embodiments of the invention.

Referring next to FIG. 2, a bottom view of the platform of the automated bedding system 10 includes the plurality of panels 12 having a first end 14 and a second end 16, a control enclosure 18, and a third segment 24 of capacitive wire. As shown in FIG. 2, the capacitive wiring third segment 24 is coupled to the control enclosure 18, which is mounted below the panels 12. In further embodiments, the control enclosure may be mounted in a different location on the bedding system 10, or may be external to the bedding system 10.

In some embodiments, third segment 24 is made from a single capacitive wire, while in other embodiments, multiple capacitive wire segments are coupled to the control enclosure 18. As will be understood, additional capacitive components, such as capacitive wire segments, may be coupled to the control enclosure 18, and arranged on the bottom of the plurality of panels 12. For example, additional capacitive wires arranged perpendicular to each other may be coupled to the control enclosure 18. In further embodiments, third segment 24 is made from a capacitive material other than wire.

Capacitive wire segment 24 may be used to detect presence or absence of a person or other being below the automated bedding system 10. For example, as arranged around the perimeter of the bed at both the first and second ends 14 and 16, a person or other body underneath the automated bedding system 10 may be detected by capacitive wire segment 24. In embodiments, based on detecting presence underneath the bedding system 10, bed articulation may be stopped. As viewed from the side in FIG. 3, the first and second segments 20 and 22 (hidden from view) create a defined sensing area on the top of the platform, near the first end 14, while the third segment 24 creates a defined sensing area on the bottom of the platform of the bedding system 10.

Figure 3:
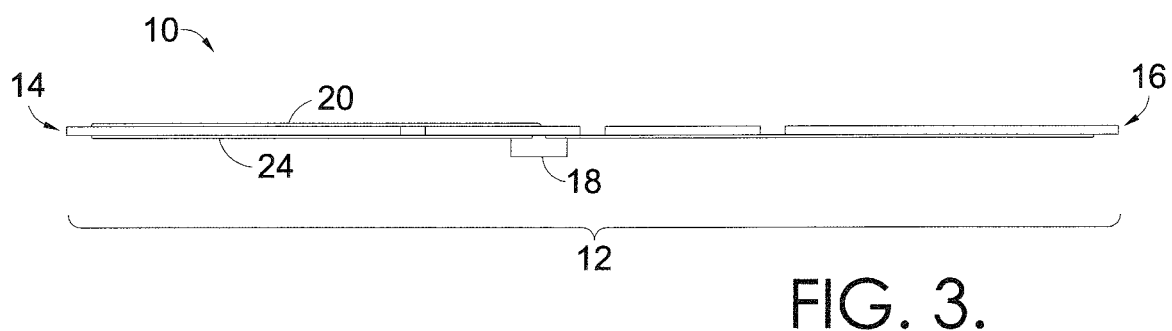
FIG. 3 is a side view of the automated bed platform of FIG. 1, with a capacitive wire coupled to the top and bottom of the platform, and the control enclosure coupled to the bottom of the platform, in accordance with embodiments of the invention.
Figure 4:
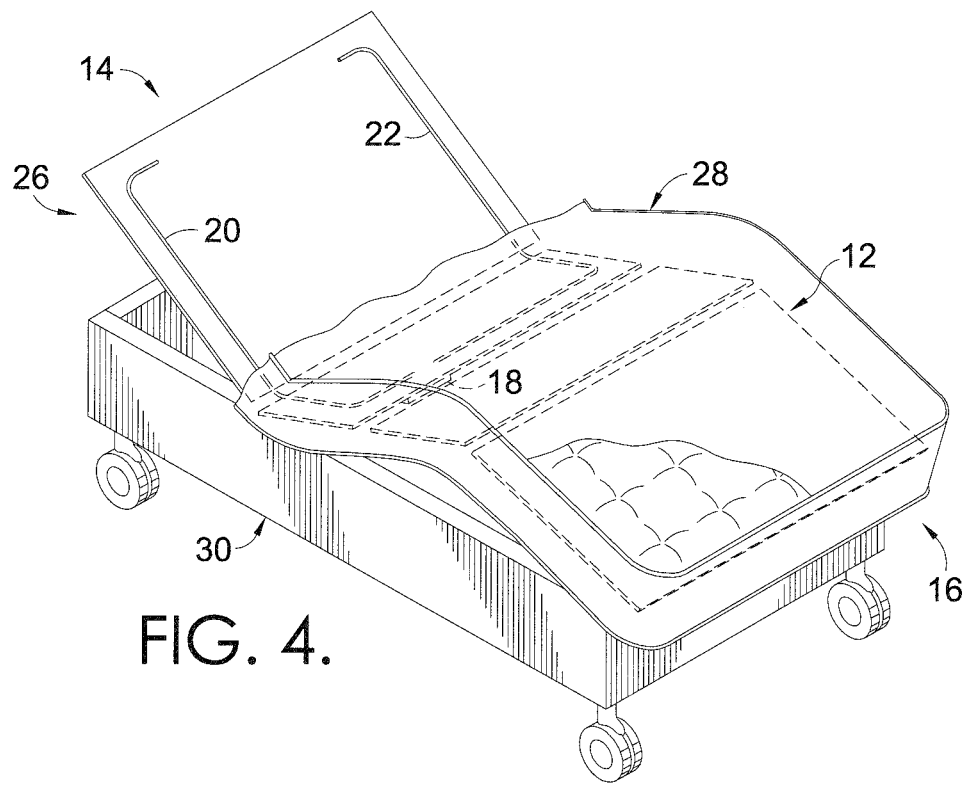
FIG. 4 is a perspective view of an automated bed with a portion of the mattress cut away to reveal the capacitive wire coupled to the top of the platform, in accordance with embodiments of the invention.

Referring next to FIG. 4, an adjustable bed 26 incorporates the automated bedding system 10 described with respect to FIGS. 1-3. The adjustable bed 26 includes a mattress 28 and a frame 30. A top portion of the mattress is cut away to reveal the first end 14 of the automated bedding system 10 platform, with the head of the bed partially raised. As described with reference to FIG. 1, capacitive wire segments 20 and 22 provide a defined sensing area near the first end 14, which detects a change in capacitance above the bed, such as the capacitance detected from a person resting on the bed.

Figure 5:
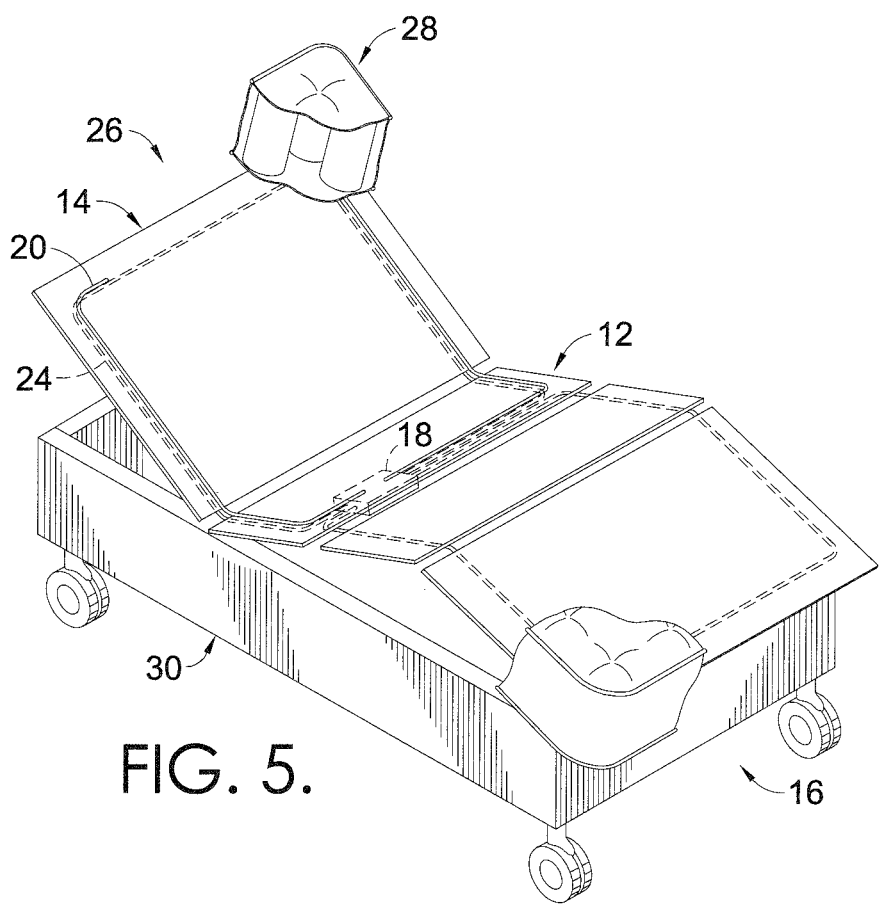
FIG. 5 is a perspective view of the automated bed of FIG. 4, with the mattress cut away to reveal the capacitive wire coupled to the top of the platform, and hidden lines indicating the capacitive wire and control enclosure coupled to the bottom of the platform, in accordance with embodiments of the invention.
Figure 6:
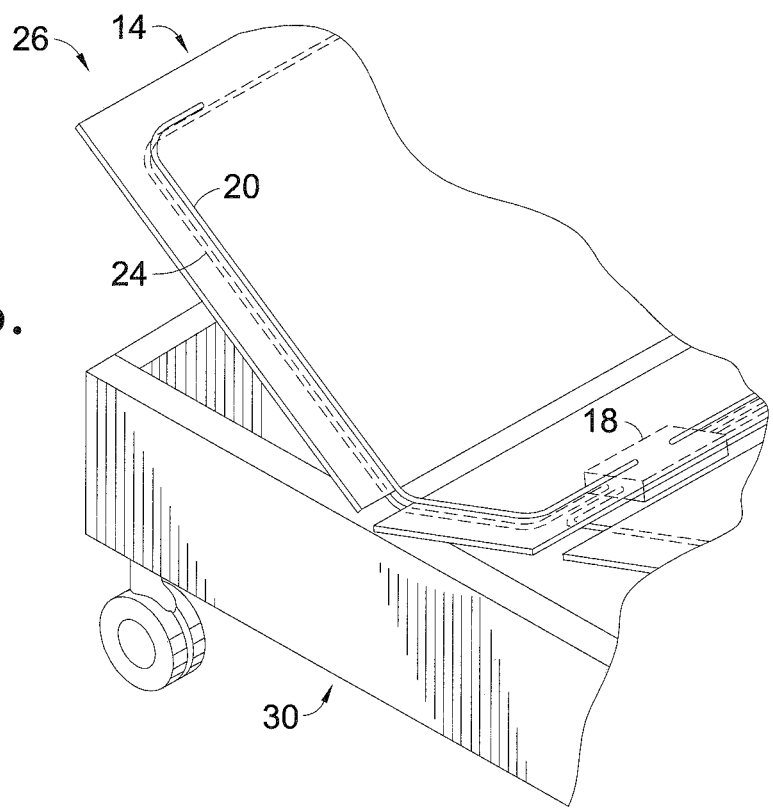
FIG. 6 is an enlarged, perspective view of the automated bed of FIG. 5, with a capacitive wire coupled to the top of the platform and hidden lines indicating the capacitive wire and control enclosure coupled to the bottom of the platform, in accordance with embodiments of the invention.

FIG. 5 depicts the adjustable bed 26 from FIG. 4, with a majority of the mattress 28 removed. As can be seen on the plurality of panels 12, first and second segments 20 and 22 of capacitive wire detect presence above the platform (e.g. on top of the mattress), while the third segment 24 detects presence below the platform (e.g. under the bed). An enlarged view of FIG. 5 is shown in FIG. 6, with hidden lines depicting capacitive wires 20 and 24 coupled to the control enclosure 18, which is mounted beneath the panels 12.

In some embodiments, in alternative or in addition to positioning of capacitive wiring around the perimeter of the panels 12 that support an adjustable mattress, conductive wire is attached around the perimeter of the mattress itself. As shown in the adjustable bed 32 of FIG. 7, conductive wire may be incorporated into the tape edge surrounding the mattress 28. As such, the attached conductive wire may work as a sensor to detect presence of a person or other body near the perimeter of the mattress 28. For example, a conductive wire may be incorporated into the top tape edge 34 around the top surface of the mattress 28. In another example, a conductive wire may be incorporated into the bottom tape edge 36 around the bottom surface of the mattress 28. During manufacturing, a conductive wire may be inserted into the tape edge automatically, as the tape edge is applied to a mattress covering. In some embodiments, when routed through the tape edge perimeter, the sensitivity of the conductive wire may be adjusted in software associated with a processor used to determine presence detection.

The capacitive wire may be routed through some or all of the tape edge around the perimeter of a mattress 28. Additionally, a tape edge may be applied to both the top and bottom edges of the mattress 28, and both the top and bottom tape edges 34 and 36 may include a capacitive wire. Accordingly, the sensitivity of the capacitive wire in the top tape edge 34 may be adjusted independently from the tape edge 36 surrounding the perimeter of the bottom of the mattress. For example, a small change in voltage detected by the capacitive wires in the top tape edge 34 of the mattress may indicate that a user has moved on the surface of the mattress, but is still on the bed. By contrast, a small change in voltage detected by the capacitive wires in the bottom tape edge 36 of the mattress may indicate that a person, or other being, is below the bed. In either case, different features associated with the automated bedding system 10 may be activated based on whether presence is detected above the bed (via capacitive wires in the top tape edge 34) or below the bed (via capacitive wires in the bottom tape edge 36).

Figure 7:
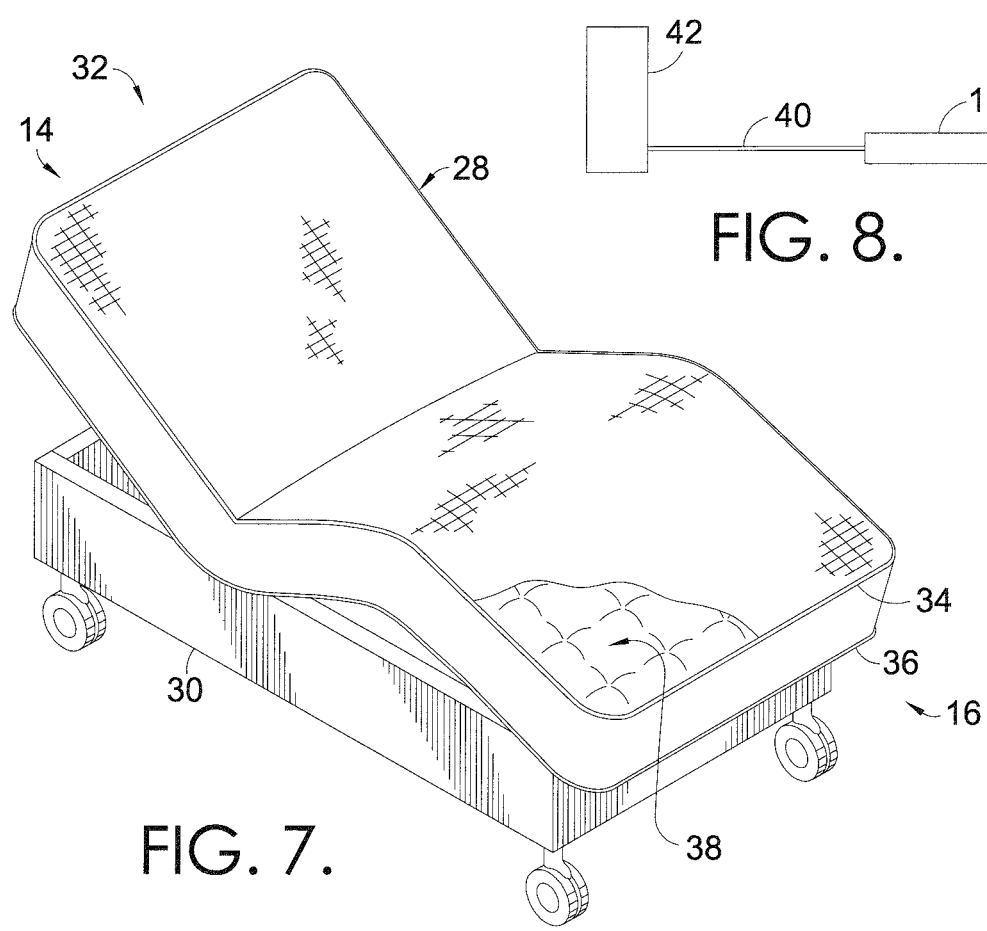
FIG. 7 is a perspective view of an automated bed with a capacitive wire incorporated into the tape edge of the mattress cover, in accordance with embodiments of the invention.

In further embodiments, a capacitive component may be incorporated into the mattress covering 38 of a mattress 28, as shown in FIG. 7. In particular, a capacitive thread may be sewn into the ticking on top of the mattress covering 38, as part of a sewn pattern. During manufacturing, a particular needle threaded with capacitive thread may be activated automatically and independently to incorporate the capacitive wire into a particular configuration on the surface of the mattress covering 38. For example, the capacitive thread may be sewn around a perimeter of the top surface of the mattress 28. In another example, the capacitive wire may be sewn in a pattern that creates perpendicular runs for capacitive detection. In one embodiment, capacitive thread sewn into the surface of a mattress covering 38 may terminate at a particular point and attach to a control enclosure 18. For example, an attachment may be used to crimp the mattress covering 38 material during sewing, to provide an attachment point for connecting the capacitive thread to a processor.

In some embodiments, a capacitive component may be incorporated into a platform-style bed. For example, a lower portion of a bed that does not articulate, such as a box spring or a mattress frame 30, may include a capacitive component that detects presence from above. In one embodiment, a capacitive wire is attached in a loop around the perimeter of the top of the frame 30, in FIG. 7. When a person or body is detected on top of the platform and/or frame 30, the articulating mattress 28 may discontinue lowering into contact with the frame 30. In one embodiment, a capacitive wire may be incorporated into the upholstery of a decorative surround (immovable frame). The sensitivity of the capacitive wire may be decreased so that direct contact is required with the edge of the surround before presence may be detected, in order to prevent false readings from a body approaching the frame and/or surround. In one embodiment, a decorative surround may include a conductive, metalized tape, such as an aluminum tape, that serves as a capacitive component for detecting presence with respect to the decorative surround. For example, a conductive metalized tape may be adhered to a perimeter of the decorative surround of an adjustable bed to determine presence near and/or on the bed, based on a change in capacitance detected by the metalized tape.

Figure 8:
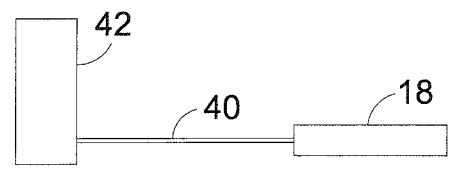
FIG. 8 is a side view of a capacitive wire coupled to a control enclosure and an inner spring of a mattress, in accordance with embodiments of the invention.

Presence may also be detected using a loop of capacitive wire incorporated inside a mattress. For example, as shown in FIG. 8, a fourth segment 40 of capacitive wire may be incorporated inside an inner spring 42, and coupled to the control enclosure 18. While only one inner spring 42 is shown, it should be understood that capacitive wire could be incorporated into one or more of the many innersprings that make up a traditional mattress. As such, the loop of capacitive wire can detect a person or object in proximity to the loop, such as a person on the mattress, above the loop of capacitive wire.

A defined sensing area is created by routing of a capacitive wire around a perimeter of a furniture item, in a variety of configurations such as those described above. For example, a capacitive wire routed around the perimeter of a mattress, such as in the tape edge around a perimeter of the top surface of a mattress, creates a defined sensing area on the area of the mattress surrounded by the sensing perimeter. As such, a person's presence within the sensing area may be detected by the capacitive wire, which a processor may use to determine when a person exits or enters a bed. A processor coupled to the capacitive component may be housed in a control enclosure, such as control enclosure 18. In one embodiment, the control enclosure 18 is mounted below the platform of an automated bedding system 10. In further embodiments, the control enclosure 18 is mounted generally beneath the mattress 28.

In embodiments, capacitive wire incorporated into the perimeter of a mattress is used to monitor a change in capacitance over a specified amount of time. The capacitive component (capacitive wire) is adapted to have a voltage based on proximity of an object to the capacitive component. Such voltage information is collected via the capacitive component and received by the processor, which determines when a change in voltage satisfies a threshold. Once a particular change in capacitance satisfies a threshold, a corresponding function associated with the automated bed may be initiated. In embodiments, a threshold for initiating a corresponding function includes a particular amount of change in voltage within a particular amount of time. For example, when using capacitance information to turn lights on/off, a particular amount of change in voltage may be required during a particular amount of time before satisfying the threshold indicating that a person has exited the bed (and before the lights may be turned on). Similarly, a particular threshold value of voltage change may be required by the processor, over a particular amount of time, before making a determination that a person has re-entered the bed (and before the lights can be turned off again). In embodiments, a processor continuously receives capacitance monitoring information, and monitors how quickly a change in capacitance occurs (how quickly the delta changes) to determine if a big enough change has occurred in a certain amount of time to satisfy a threshold, and trigger the corresponding function.

Based on satisfying a particular threshold, various features associated with the automated bedding system 10 may be activated and/or enabled. For example, an alarm clock may only be triggered if a person's presence is detected in the bed (i.e. if a threshold amount of change in voltage is detected during capacitance monitoring over a particular amount of time). In another example, additional bedding features may be activated based on presence detection by capacitive wires. Such additional integrated bedding features include having a massage motor activated to wake up a user. If a user is not present in the bed, and therefore not detected using the capacitive wires, the lack of presence detection will prevent the massage motor from running at a particular scheduled time.

A variety of other functions of the automated bedding system 10 may be controlled based on detection with a capacitive wire. In other words, a processor coupled to the capacitive wire may initiate a variety of functions based on received data indicating presence or lack of presence, as determined using capacitance information. Different functions may be controlled, such as stopping a bed from articulating when presence is detected beneath the bed, turning on/off lights based on a person exiting/entering a bed, and controlling other accessories or electrical/household appliances through internal circuitry associated with the processor. In one example, after presence is no longer detected in the bed (thereby indicating that a person has exited the bed) lights may be turned on. Additionally, when the person returns to the bed, the lights may turn off.

A variety of communication protocols may be used to control the variety of functions described above. For example, a two-way controller using ZigBee® wireless communication protocol may be used. In some embodiments, a two-way communication protocol intended for use in automation (similar to Bluetooth®) may be utilized. One embodiment of the invention may be controlled by an external sensor only, with all of the components necessary for the sensor that plug into an existing motor. In another embodiment, two separate microcontrollers may be used: one dedicated primarily for sensing purposes that, when it detects something, sends a signal to a secondary device/microcontroller that is programmed to initiate the corresponding response.

Figure 9:
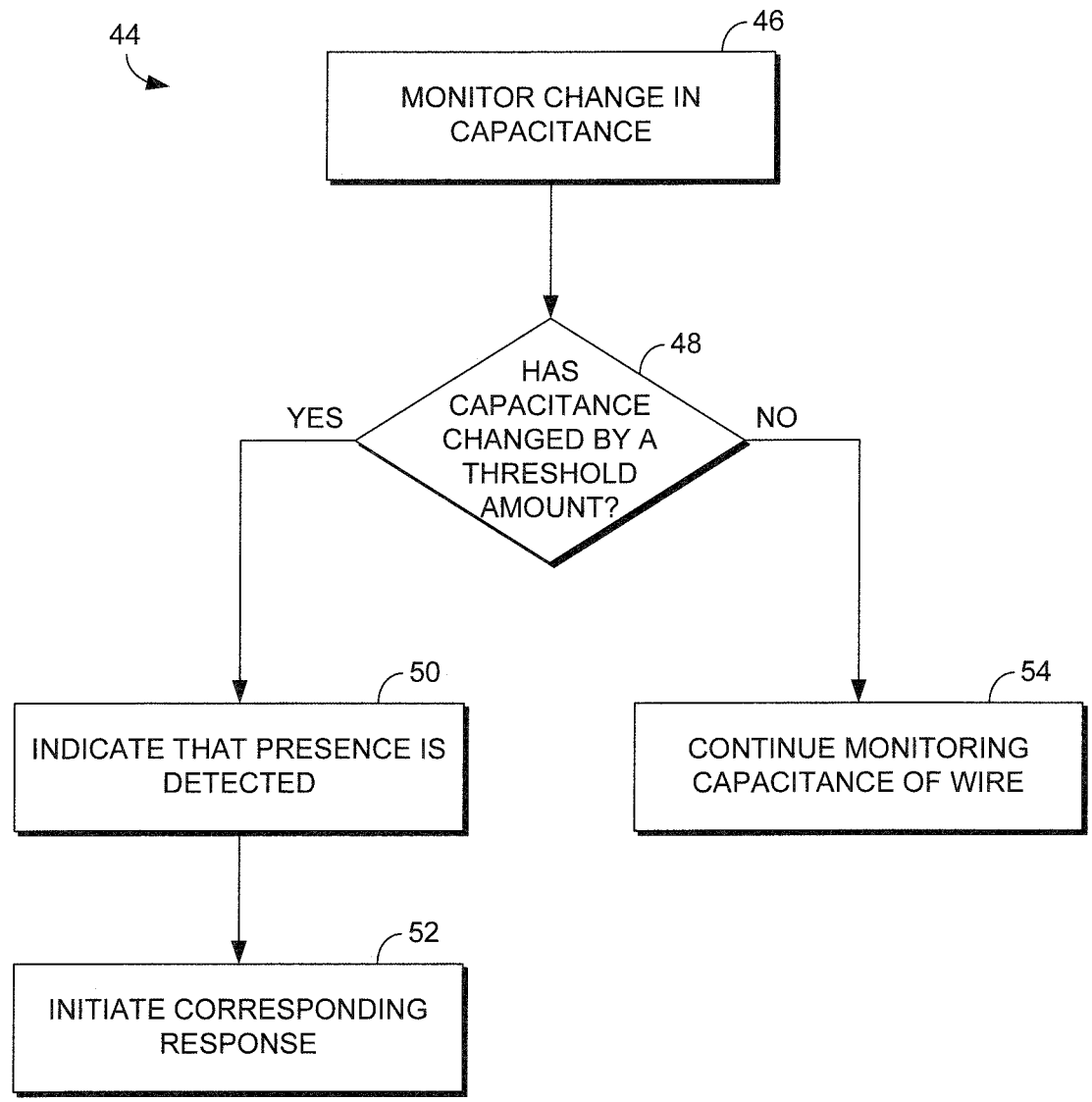
FIG. 9 is a flow diagram of an exemplary method of detecting presence with respect to a bed, in accordance with embodiments of the invention.

Turning now to FIG. 9, an exemplary flow diagram 44 depicts monitoring capacitance and making a determination of presence with respect to a furniture item. At block 46, an average change in capacitance is monitored using a capacitive wire. As discussed above, the change in capacitance indicates a change in voltage over a particular amount of time. At block 48, a determination is made regarding whether the capacitance has changed by a threshold amount. If a determination is made that the capacitance has changed by a threshold amount (i.e. a particular amount of change in voltage has occurred within a particular window of time), then an indication is made that presence has been detected at block 50, and the corresponding response is initiated at block 52. As will be understood, blocks 50 and 52 may, in some embodiments, be combined into a single step of initiation of the corresponding response based on a determination of presence detection. At block 54, if capacitance has not changed by a threshold amount, capacitance monitoring continues.

Figure 10:
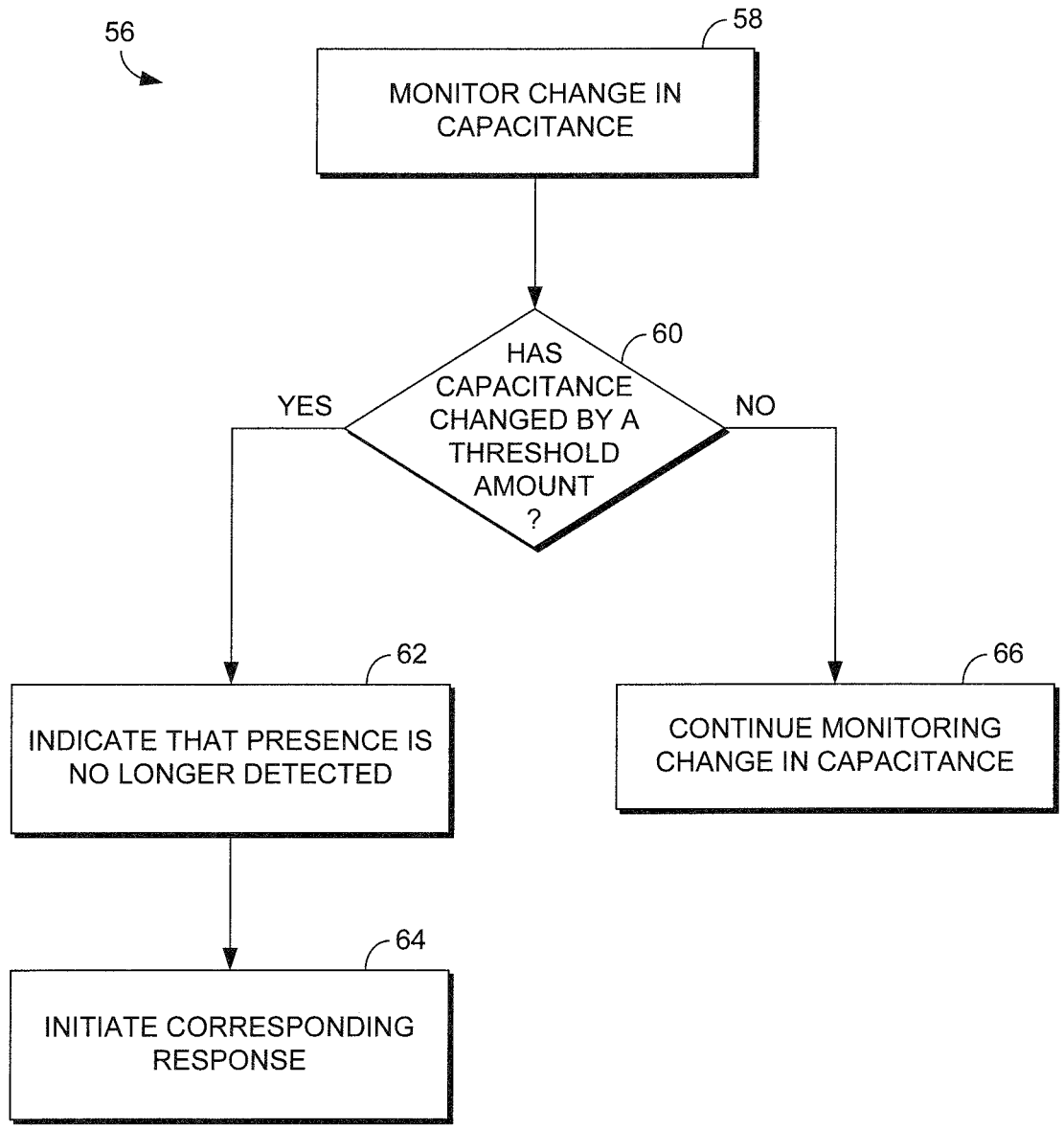
FIG. 10 is a flow diagram of an exemplary method of detecting presence with respect to a bed, in accordance with embodiments of the invention.

With reference next to FIG. 10, an exemplary flow diagram 56 depicts monitoring capacitance and making a determination that presence is no longer detected with respect to a furniture item. At block 58, an average change in capacitance is monitored using a capacitive wire. At block 60, a determination is made whether capacitance has changed by a threshold amount. At block 62, if capacitance has changed by a threshold amount, an indication that presence is no longer detected is made at block 62, and a corresponding response is initiated at block 64. At block 66, if it is determined that the threshold amount has not been satisfied, capacitance monitoring continues.

Figure 11:
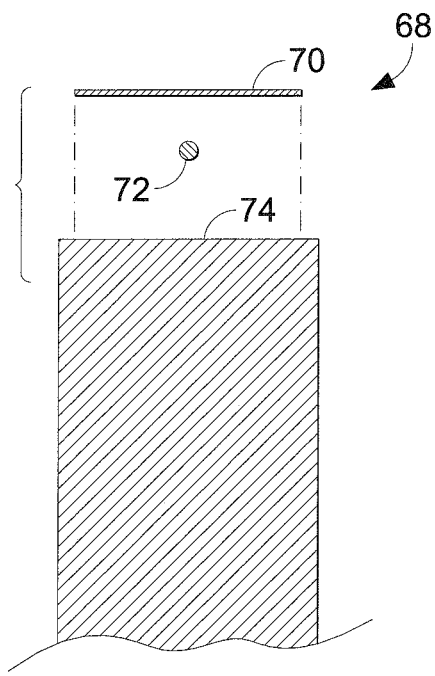
FIG. 11 is a side view of foil tape and capacitive wire for application to a substrate, in accordance with embodiments of the invention.
Figure 12:
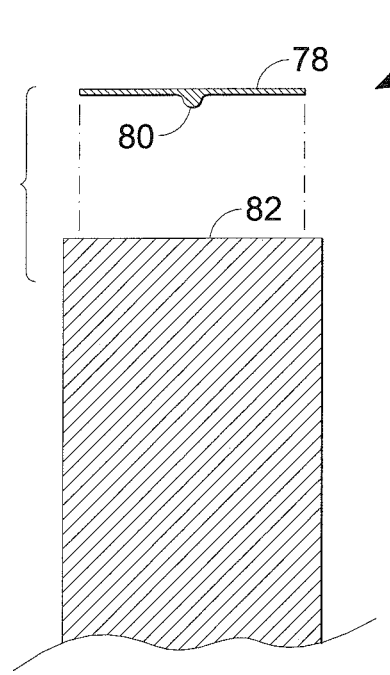
FIG. 12 is a side view of foil tape having an embedded capacitive wire for application to a substrate; in accordance with embodiments of the invention.

Referring now to FIG. 11, an exemplary capacitive sensing system 68 includes a thin-gauge foil tape 70, a thin-gauge capacitive wire 72, and a substrate 74. In embodiments, foil tape 70 attaches capacitive wire 72 to a substrate 74, such as a perimeter of an item of motion furniture or an adjustable bed. FIG. 12 depicts another exemplary capacitive sensing system 76, with a thin-gauge foil tape 78 having a thin-gauge, capacitive embedded wire 80, for attaching to a substrate 82. For example, a thin-gauge foil tape 78 embedded with a capacitive embedded wire 80 may be held to a substrate 82, such as an adjustable bed. In embodiments, capacitive wire 72 and/or capacitive embedded wire 80 may be coupled to substrates 74 and 82 using an adhesive portion of foil tape 70 and 78. Additionally, foil tapes 70 and 78 may be pressure sensitive adhesive (PSA) foil tapes, for attaching to substrates 74 and 82. In further embodiments, thin-gauge foil tape 70 and 78 are used to attach capacitive wire 72 and/or capacitive embedded wire 80, to a substrate. In addition or in alternative to attaching capacitive wire 72 or capacitive embedded wire 80 using foil tape, such capacitive wiring systems may be coupled to a substrate using staples, glue, adhesive, or otherwise fastened to a number of surfaces to create a capacitive circuit on the adjustable bed or motion furniture item.

Figure 13:
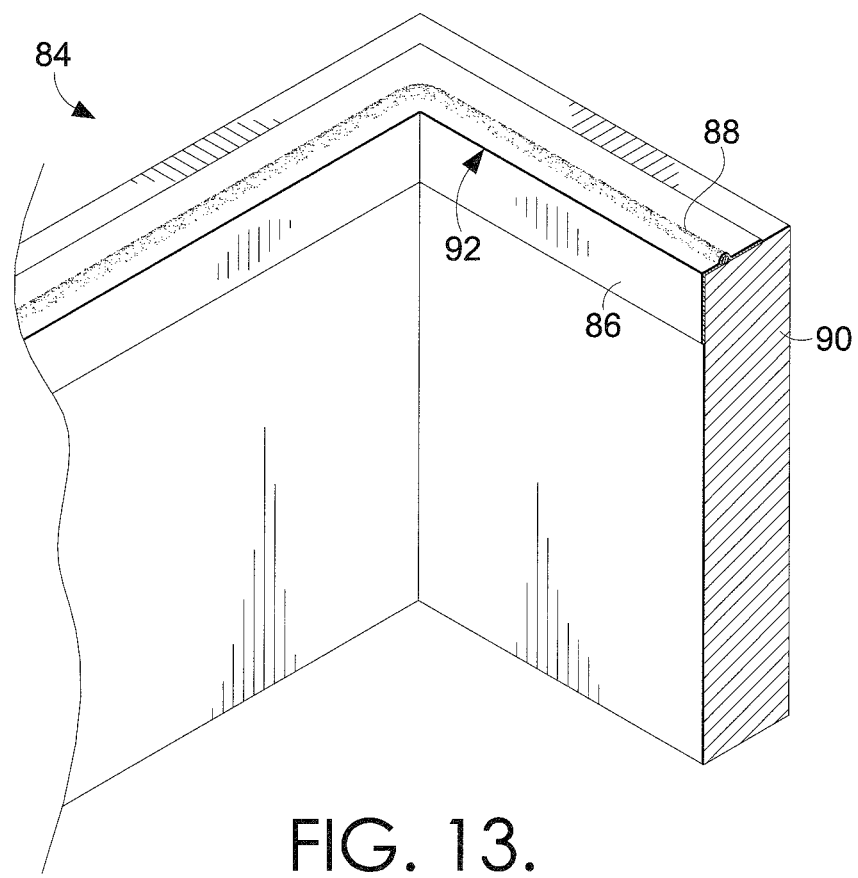
FIG. 13 is a perspective view of a foil tape having an embedded capacitive wire, applied to an edge of a substrate, in accordance with embodiments of the invention.

In the example of FIG. 13, a capacitive sensing system 84 includes a thin-gauge foil tape 86 with an embedded wire 88 coupled to a substrate 90. In particular, the foil tape 86 is applied to an inner edge 92 of substrate 90, such as an inner edge of an adjustable bed frame. In embodiments, foil tape 86 is a PSA tape that is adapted to adhere to a surface of substrate 90, while permitting the foil tape 86 (and the embedded wire 88) to maintain a charge during monitoring of capacitance. For example, foil tape 86 may be coupled to a controller and monitored using a software application that analyzes changes in capacitance, as detected via the foil tape 86 and the embedded wire 88. For example, foil tape 86 may be coupled to a controller (such as a microcontroller) associated with a software application, and used to capacitively detect mammalian touch in components such as doors, windows, furniture, or other items of moveable furniture, such as an adjustable bed. In embodiments, foil tape 86 is capacitive, and is coupled to the embedded wire 88 that is electrically coupled to the microcontroller.

Figure 14:
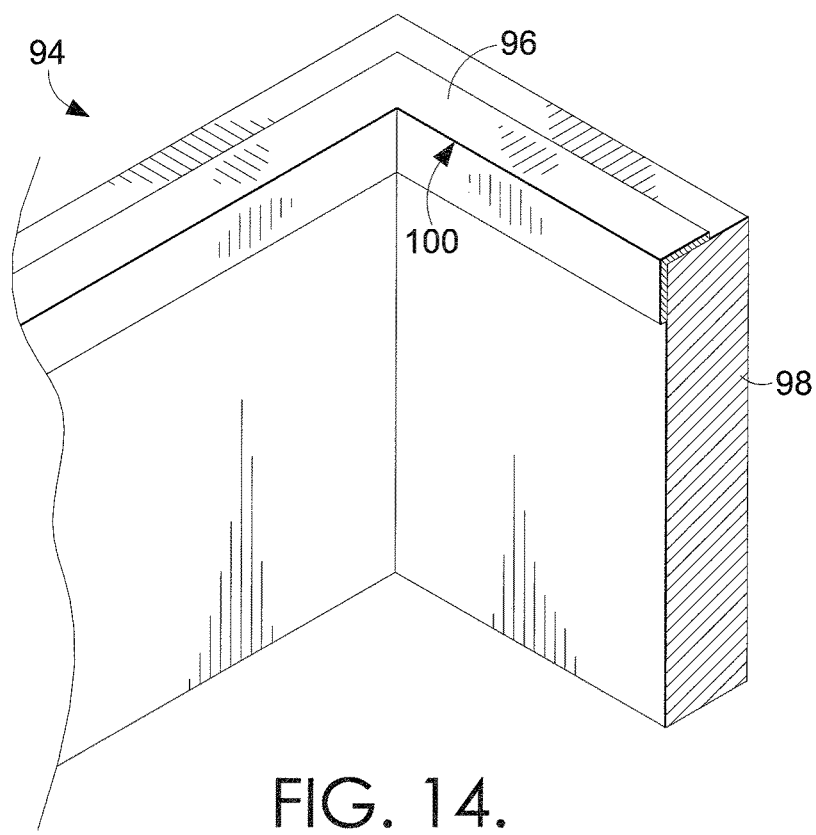
FIG. 14 is a perspective view of a foil tape applied to an edge of a substrate, in accordance with embodiments of the invention.
Figure 15:
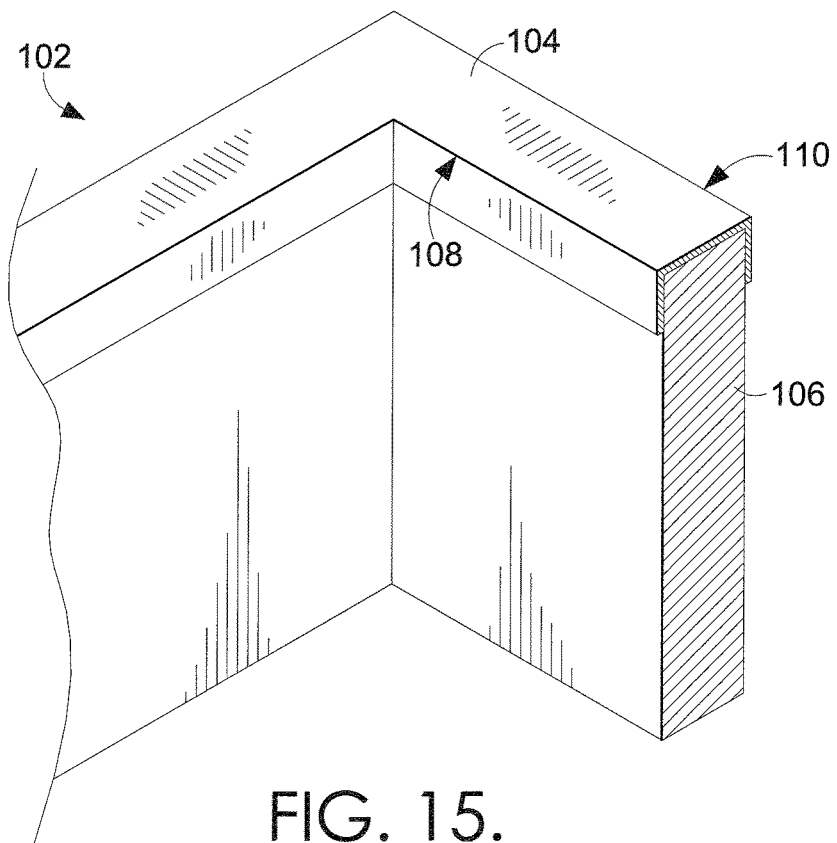
FIG. 15 is a perspective view of a foil tape applied to multiple edges of a substrate, in accordance with embodiments of the invention.

In FIG. 14, a capacitive sensing system 94 includes a capacitive cap 96 coupled to a substrate 98 along an inner edge 100. In embodiments, substrate 98 may be a frame and/or base of an adjustable bed, with an inner edge 100, on which capacitive cap 96 is applied and used for capacitive detection. In one embodiment, capacitive cap 96 is a sensing material, such as a metalized tape, that is able to detect changes in capacitance, and can be placed under or on top of fabrics. Similarly, with reference to FIG. 15, capacitive sensing system 102 depicts a capacitive cap 104 coupled to the top of substrate 106. In particular, capacitive cap 104 is applied along inner edge 108 and outer edge 110. In one embodiment, capacitive cap 104 is a foil and/or metalized tape that can detect a change in capacitance. In further embodiments, substrate 106 may be a frame and/or base of an adjustable bed, with the inner edge 108 and outer edge 110, on which capacitive cap 104 may be used to detect presence based on a change in capacitance detected by the capacitive cap 104. In some embodiments, capacitive cap 96 and/or capacitive cap 104 may be a metallic coated plastic trim that can be used as a sensing material, in addition to or in alternative to a conductive wire and/or foil tape. In further embodiments, capacitive caps 96 and 104 may be made from other ferrous or metallic shapes, such as angles, zees, tees, caps, etc. As such, in embodiments using foil tape for capacitive detection, additional metallic materials could be used to provide capacitive detection of presence with respect to an adjustable bed.

In embodiments, a thin-gauge perimeter wire may be installed around a perimeter of an adjustable bed and/or frame of an adjustable bed. In embodiments, the thin-gauge perimeter wire may be coupled to the base of an adjustable bed using tape; adhesives; fasteners; staples; or may be embedded or extruded through foam; covered in a thin foil tape; or attached via one or more additional/alternative hardware mechanisms. In one embodiment, the perimeter wire may be embedded in foil tape prior to application to the bedding device, as in the example of FIGS. 12-13. In a further embodiment, the perimeter wire may be connected to a coaxial cable using sockets, such as using an RCA jack and socket, or a mechanism such as a Molex® or an Amp connector.

In embodiments, the foil tape and the perimeter wire are capacitively coupled and sensitive to touch. That is, similar to the capacitive wire segments used to detect presence or absence of a person or other being on top of an automated bedding system, foil tape and a perimeter wire coupled to a frame or base of an adjustable bed may also be capacitively coupled and able to detect presence or absence based on a detected change in capacitance. Further, such capacitance detection may be adjusted to a required amount of sensitivity for presence detection, such as "fine tuning" the microcontroller and/or software for detection using thicker upholstery.

In a further embodiment of the invention, ports, grommets, and/or sockets are added to an automated bedding mattress construction to allow connection of a capacitive wire to spring an assembly, thereby creating a capacitive array internal to the mattress. As discussed with reference to FIG. 8, capacitive wire may be incorporated into one or more inner springs of a mattress. Further, in one example, a perimeter wire coupled to an automated bed frame may also be coupled to the inner spring of a mattress assembly to create a capacitive array that detects presence with relation to both the mattress and the frame. In some embodiments, a wire mesh, such as netting and/or a screen, may be capacitively connected to a capacitive sensing system for detection associated with the same perimeter wire.

In some embodiments, body capacitance can be used to operate different types of switches as a capacitive touch sensor will respond to close-proximity detection of a change in capacitance. Accordingly, the tip of a finger may be detected by a capacitive sensor, with a minimal amount of pressure (i.e., triggered without forceful touching), and the capacitive sensing system of an automated furniture item may detect minimal amounts of bodily contact.

Figure 16:
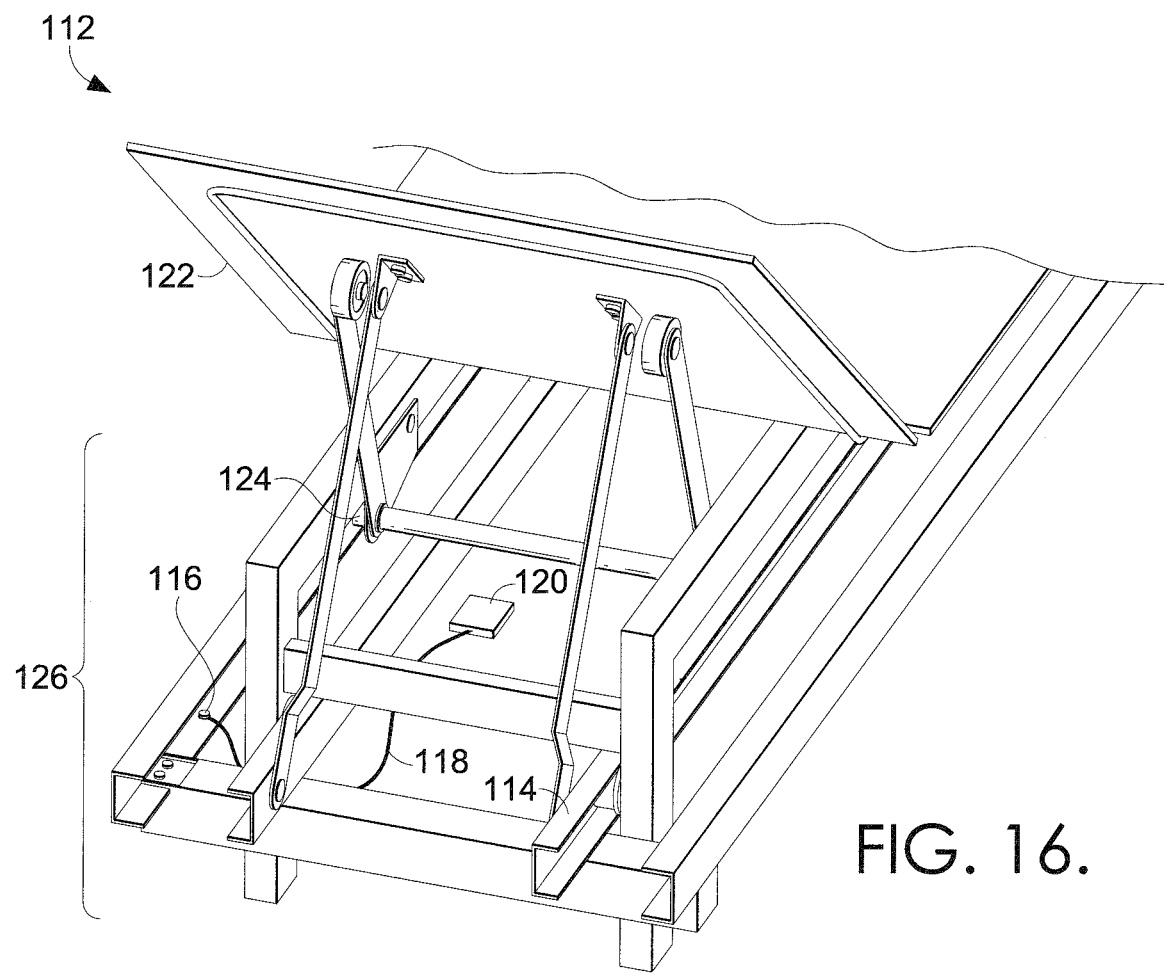
FIG. 16 is a rear perspective view of an adjustable bed, in accordance with embodiments of the invention.

Turning next to FIG. 16, a rear-perspective view of an adjustable bed 112 includes a metal, adjustable bed frame 114 coupled at a contact point 116 to a coaxial cable (coax) 118 and a controller 120. As a portion of the adjustable bed 122 is in motion, presence near the frame 114 of the adjustable bed 122 may be detected by the controller 120, based on the capacitance monitored via bed frame 114. Accordingly, the metal, adjustable bed frame 114 is used as a sensor, with the metal being a conductive material adapted to carry a charge. In embodiments, multiple metal components 126 are coupled together to form the adjustable bed frame 114. Many of these parts are coupled together at joints 124 that are also adapted to carry a charge, which enables the controller 120 to detect presence with respect to contact with any conductive portion of the adjustable bed frame 114. As will be understood, embodiments discussed with reference to FIG. 16 may also be implemented in additional moveable furniture items, such as chairs.

In one embodiment, when a person contacts the adjustable bed frame 114, the frame's normal capacitance is increased. In response to the increase in capacitance by contact with the bed frame 114, the controller 120 measures the change in capacitance of the bed frame 114 against a known capacitance of the frame. In embodiments, controller 120 may be mounted to the bed frame 114 directly, with a separate microcontroller for a sensor, and a separate microcontroller for controlling the bed motion. Accordingly, a sensing microcontroller may use separate channels for wire detection of presence (discussed above) and frame detection of presence. In embodiments, the use of a coax 118 to directly connect the bed frame 114 to the controller 120 reduces the amount of interference caused during monitoring and/or detection, as the coax exits the controller 120 and will not detect any signals until it reaches the bed frame 114.

In one example, as connected to the bed frame 114 via coax 118, controller 120 measures capacitance by pulsing the bed frame 114 with a voltage, such as a low voltage having a minimal amount of current. In between pulses from the controller 120, the signal fed into the controller's analog to digital converter (ADC) is used to measure how much the voltage changes over time. In one embodiment, one microcontroller of the controller 120 may send out a charge, with the resulting charge being read by another microcontroller having a processor that monitors how quickly the detected charge decays. In one embodiment, when a body is in contact with the frame, the controller 120 monitors how quickly the change in capacitance rises, and how far the change in capacitance rises.

Based on detection of a change in capacitance by the controller 120, the actuator of the adjustable bed frame 114 may be disabled during a motion operation if it is determined that human contact is detected. In embodiments, the controller 120 may monitor the overall levels of capacitance of the bed frame 114 to determine what changes in capacitance do and do not satisfy a threshold for determining that contact has been made. For example, the rate of change and the amount of change may be monitored to determine whether a threshold for contact has been met, and whether the travel of the bed frame 114 should be altered. In embodiments, when triggered by a controller 120, the actuators of an adjustable bed 112 may be programmed to stop all motion (such as downward motion) when contact is detected by the conductive, metal bed frame 114. In such an example, when presence of a human is detected underneath a moving, adjustable bed 112, the detection by bed frame 114 may indicate to the controller 120 to discontinue travel of the bed frame 114. In another embodiment, in response to detection of a human underneath a moving, adjustable bed 114, the actuators may reverse and/or retract motion by a particular distance, such as backing up an inch if the bed frame 114 was lowering to a downward position when presence was detected.

Accordingly, to re-start travel once a condition has been met for stopping travel by the controller 120, a user may indicate to the adjustable bed 112 that 1) the condition that triggered the indication of presence has gone away, and/or 2) that the user has again selected motion of the adjustable bed frame 114 by providing an indication to the controller 120 (such as pushing a button on a controller of the adjustable bed 112). In further embodiments, controller 120 may track the usage of an adjustable bed 112, and the subsequent commands received after detecting presence near a moving bed frame 114. Such tracking may be used to designate specific actions required by the bed in response to presence detection, such as moving of a bed into a fully-upright position, or discontinuing motion of the bed prior to initiating a subsequent lowering once presence is no longer detected.

Figures 17A, 17B, 17C:
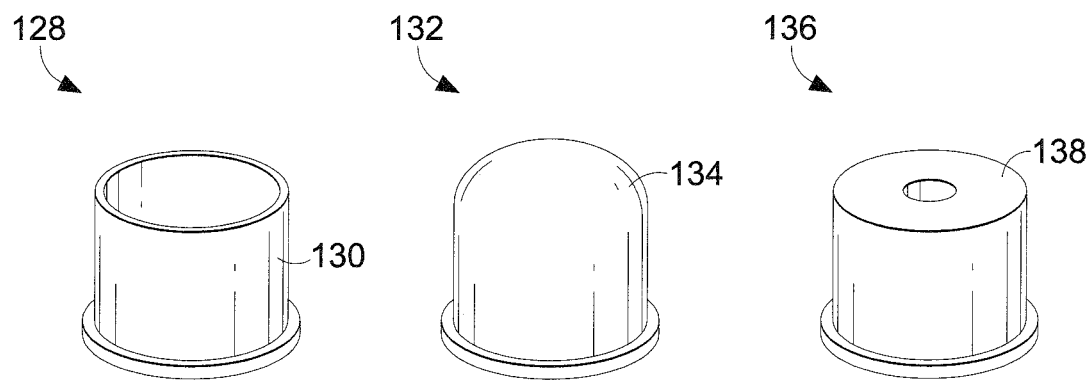
FIG. 17A is a conductive bushing, in accordance with embodiments of the invention.
FIG. 17B is a conductive encapsulating torque tube, in accordance with embodiments of the invention.
FIG. 17C is a conductive bushing, in accordance with embodiments of the invention.

With reference to FIG. 17A, an exemplary metallic bushing 128, such as conductive bushing 130, may be used to provide an acceptable transfer of energy within a metal assembly, such as the metal, adjustable bed frame 114 of FIG. 16. For example, one or more parts of an adjustable bed frame 114 may be coupled together at joints 124 that use conductive bushing 130 to carry a charge, thereby enabling a controller 120 to detect presence with respect to contact with any conductive portion of the adjustable bed frame 114. Additional embodiments of metallic bushings 132 and 136 are depicted in FIGS. 17B and 17C. FIG. 17B depicts an exemplary, conductive encapsulating torque tube 134, while FIG. 17C depicts an exemplary, conductive bushing 138 for use with capacitive detection associated with a metallic assembly. Accordingly, in some embodiments, conductive bushings are made using conductive materials to create "conductive" plastics, such as using stainless steel, carbon fibers, carbon black, carbon powder, graphite, and the like. In another embodiment, conductive bushings are made using chemical additives or coatings added to plastic bushings to increase the conductivity. In further embodiments, a metal coating on the outside of a bushing, or a metal coating encapsulated inside a plastic bushing, may be used to generate conductive bushings. As will be understood, a number of metallic, conductive, and/or chemical additives, treatments or materials may be used to create conductive bushings for use in a metallic assembly that carries a charge and is used to detect capacitance, such as a metallic, adjustable bed frame 114.

As will be understood, "traditional" bushings used in adjustable beds or motion furniture are often made with electrically-insulating acetals, which prevent the transfer of a charge during detection of capacitance. Accordingly, in some embodiments, parasitic capacitive coupling may be used to capacitively couple components of the adjustable bed or motion furniture metallic assemblies. In a further embodiment, jumper wires are used to connect components of an adjustable bed that are electrically isolated due to non-conductive bushings. For example, electrically-isolated parts of a metal, adjustable bed frame may be coupled to other conductive portions of the bed frame using jumper wires.

In embodiments, bushings and other washer materials being carbon-fiber filled acetal with moderate surface conductivity may be used. Such bushings and washers may assist in the transfer of energy throughout a metal, adjustable bed frame 114, its components, and related assemblies. In some embodiments, a metallic bed frame may be capacitively coupled to other assemblies in the adjustable base. Accordingly, the term "metallic assembly" may be used to refer to any of the frame, components of the frame, and assemblies of an adjustable furniture item, such as a bed.

In one embodiment, acetal carbon-fiber filled bushings are less than or equal to the surface resistivity of 1.0E+3 ohm and have a volume resistivity of 1.0E+3 ohm centimeter (using test methods per IEC 60093). The human body capacitance is the input to the metallic assembly, and the carbon-fiber filled bushings act as "jumper wires" to transmit energy between the metallic assemblies in adjustable beds and motion furniture. In one embodiment, electroceramics (ceramic materials specifically formulated for electrical properties) may be tailored for use as a highly-conductive bushing material, such as the electronically conductive ceramic consisting of Indium Tin Oxide (ITO), Lamthanum-doped strontium titanate (SLT), and yttrium-doped strontium titanate (SYT).

Figure 18:
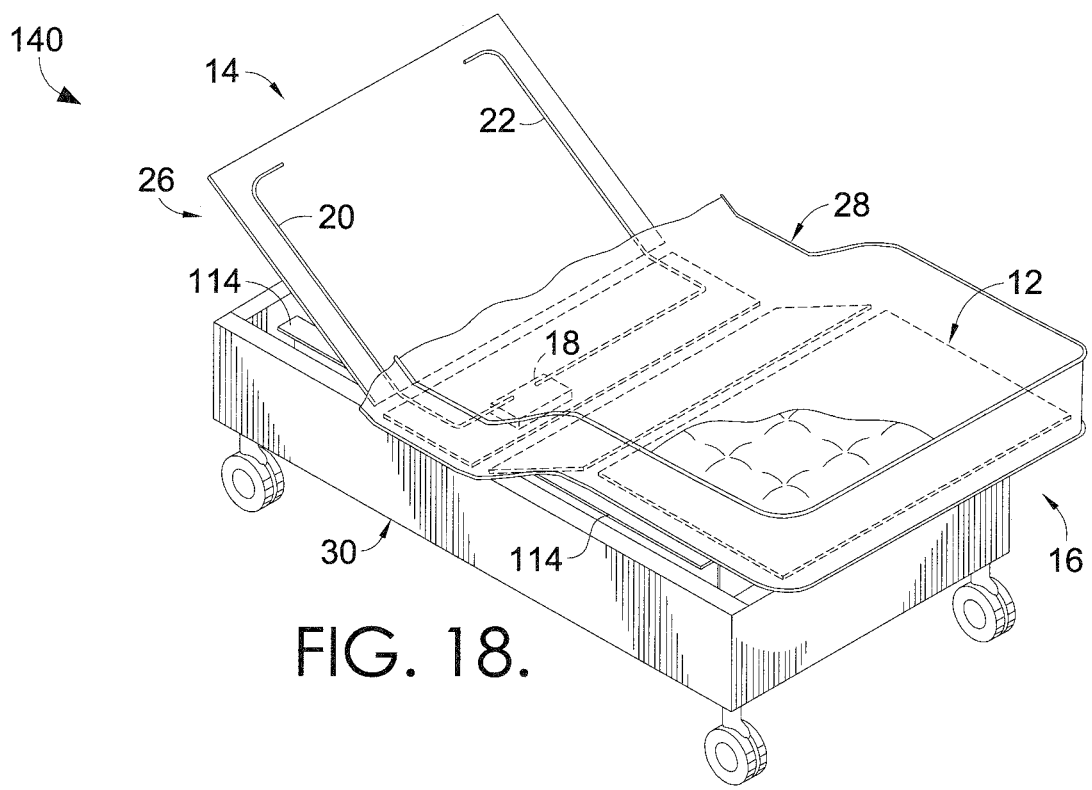
FIG. 18 is a perspective view of an automated bed with head and feet portions of the bed raised to partially reveal a metal, adjustable bed frame, and a portion of the mattress cut away to reveal capacitive wire coupled to the top of the platform, in accordance with embodiments of the invention.

Turning next to FIG. 18, an automated bedding system 140 includes an adjustable bed 26 having a plurality of panels 12 with a first end 14 and a second end 16, a control enclosure 18 (mounted below the plurality of panels 12), a first segment 20 of a capacitive wire, and a second segment 22 of a capacitive wire. In some embodiments, the first end 14 may be referred to as the "head" of the bed, while the second end 16 may be referred to as the "foot" of the bed. In FIG. 18, adjustable bed 26 is depicted in a raised position with the first end 14 raised and the second end 16 raised, to reveal a portion of the metal, adjustable bed frame 114 of the adjustable bed 26. In embodiments, the bed frame 114 is a conductive material used to carry a charge and monitor a change in capacitance, as discussed above. Accordingly, in an example where the first end 14 of the adjustable bed 26 is being lowered, detection of human contact with the bed frame 114 may trigger the bed to discontinue downward motion. In some embodiments, detection of contact with bed frame 114 may also trigger a retracting and/or raising of the first end 14. Similarly, in another embodiment, the lowering of second end 16 may be stopped based on detection of human presence by bed frame 114.

Figure 19:
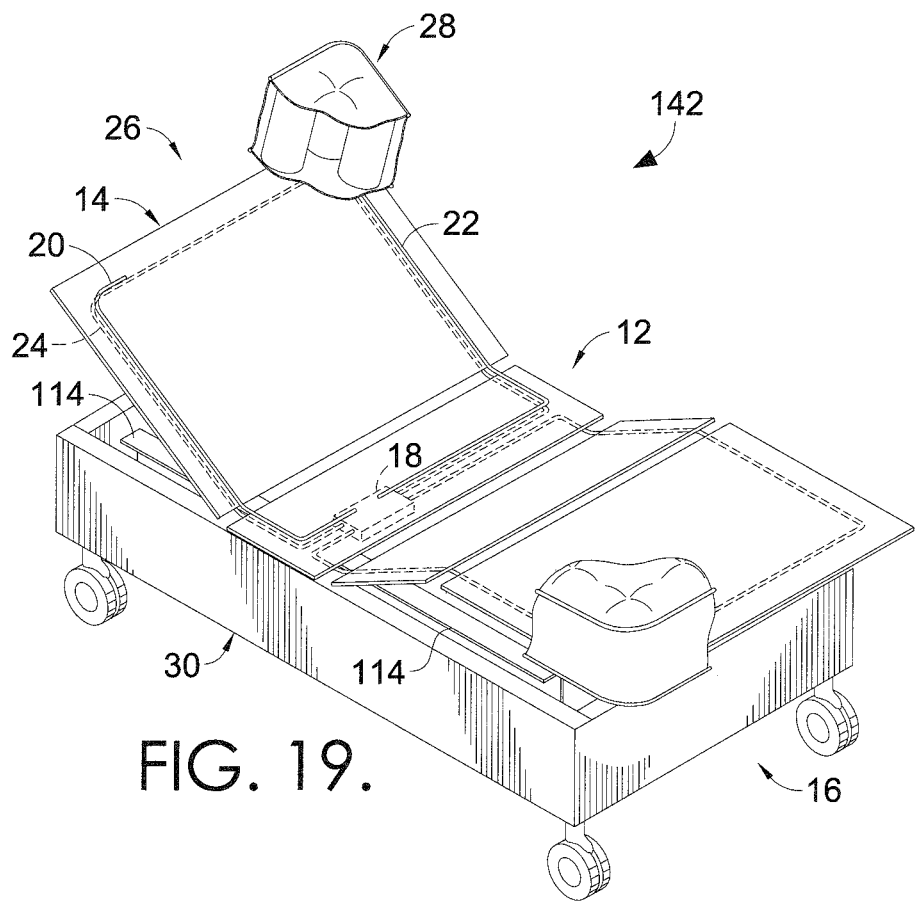
FIG. 19 is a perspective view of the automated bed of FIG. 18, with head and feet portions of the bed raised to partially reveal a metal, adjustable bed frame, and with the mattress cut away to reveal a capacitive wire coupled to the top of the platform and hidden lines indicating the capacitive wire and control enclosure coupled to the bottom of the platform, in accordance with embodiments of the invention.
Figure 20:
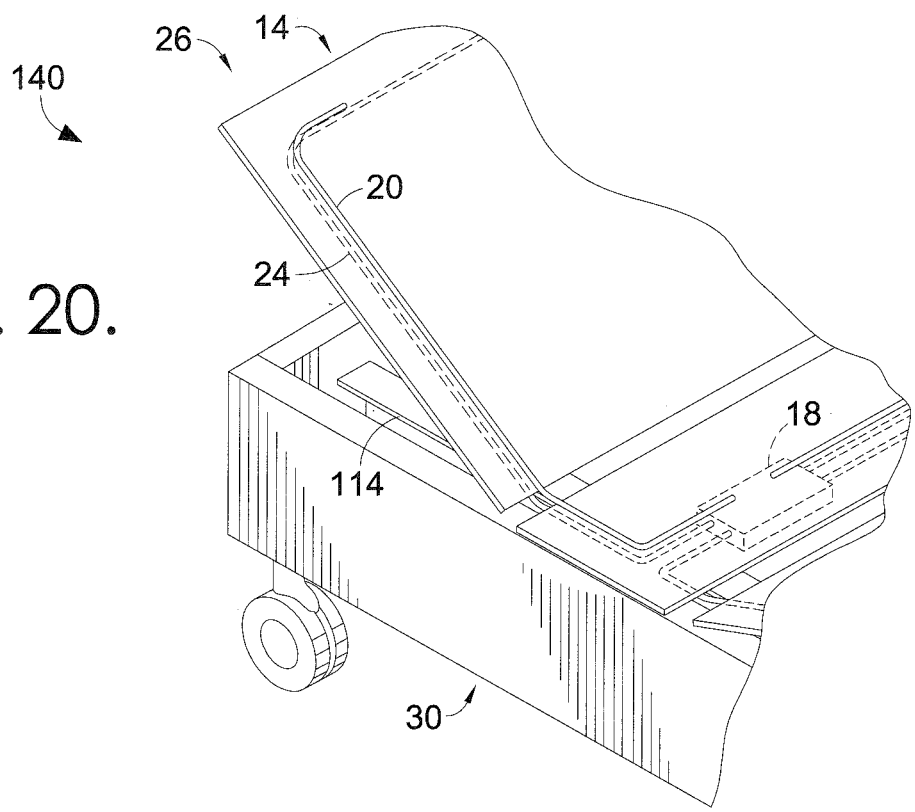
FIG. 20 is an enlarged, perspective view of the automated bed of FIG. 19, with head and feet portions of the bed raised to partially reveal a metal, adjustable bed frame, and with a capacitive wire coupled to the top of the platform and hidden lines indicating the capacitive wire and control enclosure coupled to the bottom of the platform, in accordance with embodiments of the invention.

As can be seen in FIG. 18, capacitive wiring around a perimeter of a platform may be used in addition or alternative to the capacitive detection using bed frame 114. Accordingly, FIG. 19 depicts the adjustable bed of FIG. 18, with a majority of the mattress 28 removed. As can be seen on the plurality of panels 12, first and second segments 20 and 22 of capacitive wire detect presence above the platform (e.g. on top of the mattress), while the third segment 24 detects presence below the platform (e.g. under the bed). An enlarged view of FIG. 19 is shown in FIG. 20, with hidden lines depicting capacitive wires 20 and 24 coupled to the control enclosure 18, which is mounted beneath the panels 12. Further, the metal frame 114 is shown below the mattress 28, and can be used to detect presence, in addition or in alternative to the capacitive wire segments on the platform 12.

Figure 21:
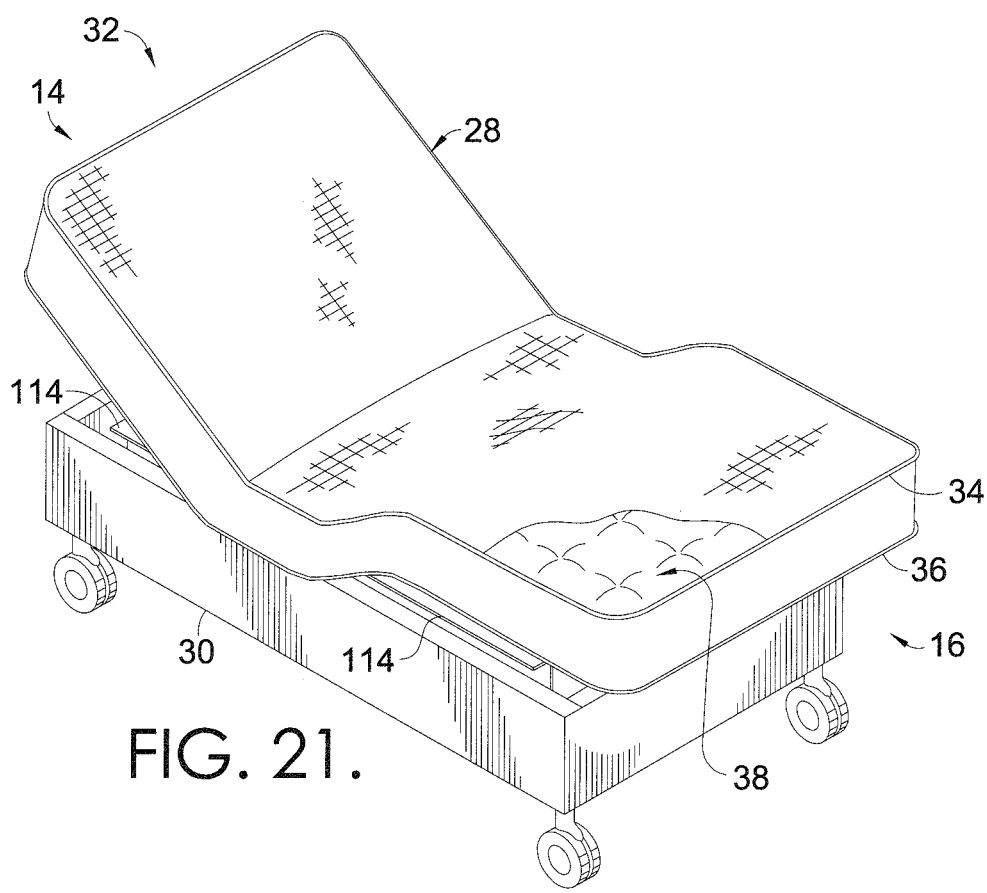
FIG. 21 is a perspective view of an automated bed with head and feet portions of the bed raised to partially reveal a metal, adjustable bed frame, and a tape edge surrounding a perimeter of the mattress cover, in accordance with embodiments of the invention.

With reference to FIG. 21, an enlarged, perspective view of the automated bed of FIG. 19, with head and feet portions of the bed raised to partially reveal a metal, adjustable bed frame 114 is shown. Additionally, in some embodiments, a conductive wire may be incorporated into the top tape edge 34 around the top surface of the mattress 28. In another example, a conductive wire may be incorporated into the bottom tape edge 36 around the bottom surface of the mattress 28. During manufacturing, a conductive wire may be inserted into the tape edge automatically, as the tape edge is applied to a mattress covering. In some embodiments, when routed through the tape edge perimeter, the sensitivity of the conductive wire may be adjusted in software associated with a processor used to determine presence detection. Accordingly, in some embodiments, presence may be detected with respect to an adjustable bed using both wiring incorporated into the perimeter of the mattress, the metal, adjustable bed frame 114 itself being used as a capacitive sensor.

Figure 22:
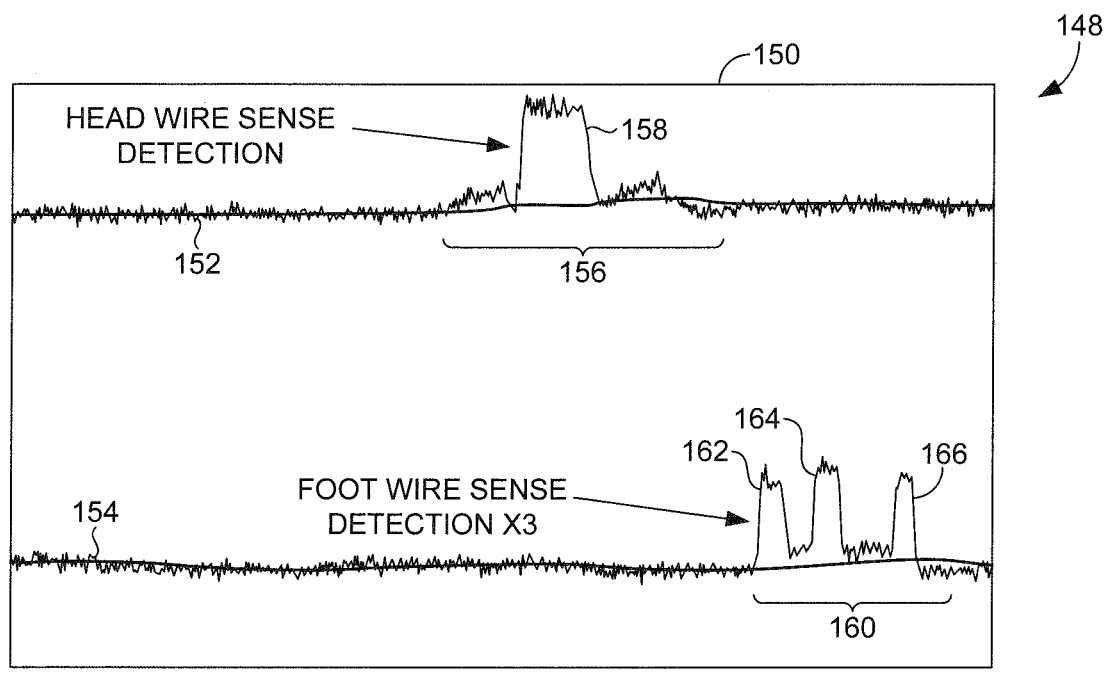
FIG. 22 is an exemplary graphical display of the measure of head wire sense detection and foot wire sense detection associated with an adjustable bed, using capacitance monitoring, in accordance with embodiments of the invention.
Figure 23:
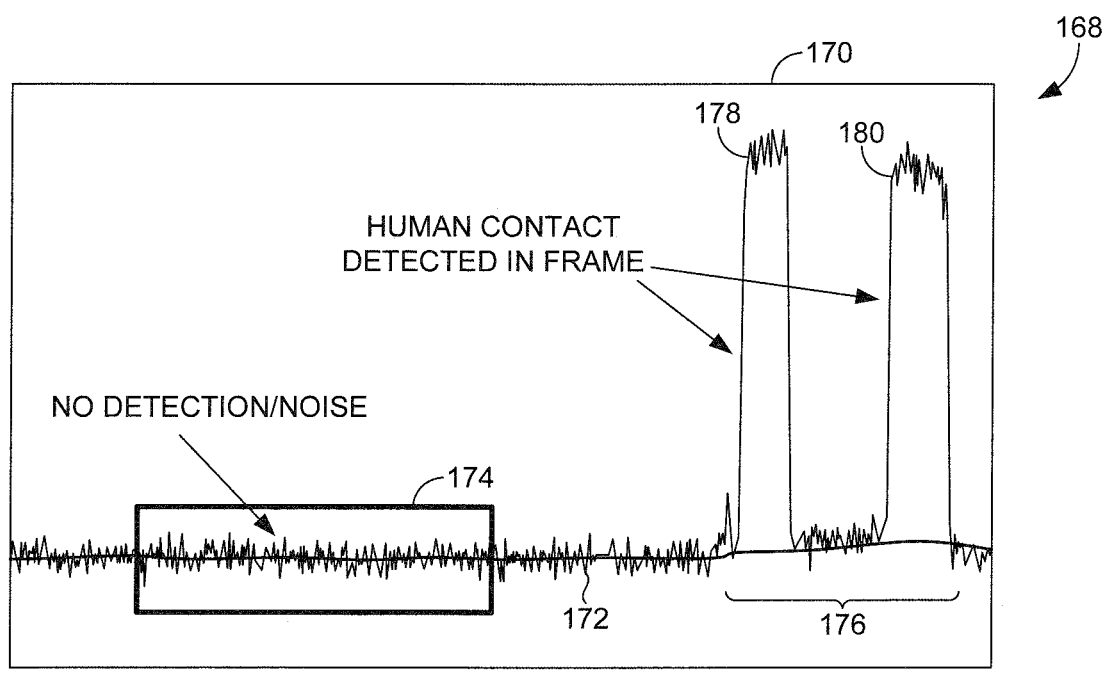
FIG. 23 is an exemplary graphical display of the measure of contact detection with a metal, adjustable bed frame using capacitance monitoring, in accordance with embodiments of the invention.
Figure 24:
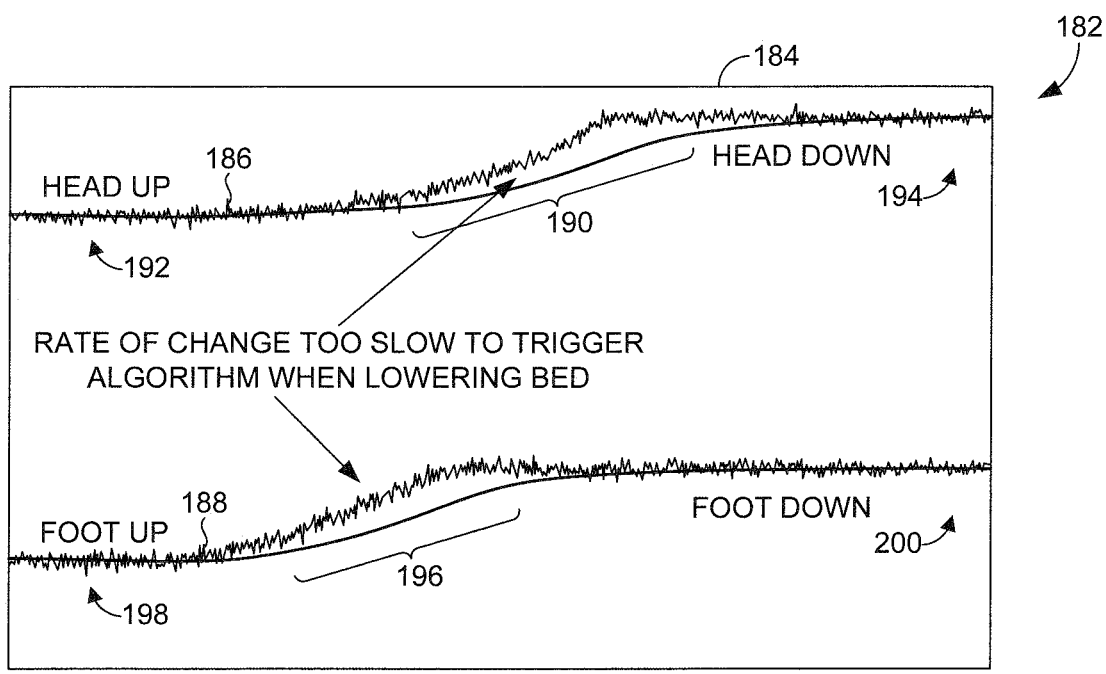
FIG. 24 is an exemplary graphical display of the measure of the rate of change of monitored capacitance during lowering of the head portion and foot portion of a metal, adjustable bed frame, in accordance with embodiments of the invention.

With reference to FIGS. 22-24, capacitive detection is monitored over time, noting changes in capacitance due to presence detection, noise interference, and movement of the automated bed. For example, in FIG. 22, capacitance detection 148 is shown on a display 150 that includes both head wire monitoring 152 and foot wire monitoring 154. As shown along the path of the head wire monitoring 152, head wire sense detection area 156 indicates a peak 158 of change in capacitance. Similarly, along the path of the foot wire sense monitoring 154, foot wire sense detection area 160 indicates three peaks 162, 164, and 166 that indicate changes in capacitance. Accordingly, in one embodiment, a capacitive wire near a first end 14 (head) of an adjustable bed may detect a change capacitance (such as peak 158) that triggers one or more features of the adjustable bed. In another embodiment, a capacitive wire near a second end 16 (foot) of an adjustable bed may detect a change in capacitance (such as one or more of the peaks 162, 164 and 166) and be used to trigger one or more features of an adjustable bed. In some embodiments, triggering a feature of an adjustable bed requires satisfying a threshold for detection. In other words, the monitoring system may detect changes in capacitance in relation to the head or foot portions of the bed, but the change in capacitance may not be great enough to satisfy a threshold for detection that triggers a feature. For example, minimal movement of a person on a mattress may indicate some level of change in capacitance to the monitoring system, without triggering any change in movement of the bed or activity of associated features. Meanwhile, complete removal of user from a bed, which alters the detected capacitance above a particular threshold may indeed trigger the threshold for an associated activity, such as lowering the foot of the bed and/or triggering lights to come on.

Turning next to FIG. 23, capacitance detection 168 is shown on a display 170 that includes monitoring of capacitance 172 of a metal, adjustable bed frame. Detection area 174 designates the indication of no presence being detected, and also provides an indication of the inherent level of noise that is detected by the system. Further, detection area 176 indicates peaks 178 and 180 of changes in capacitance, which exhibit that human contact with the bed frame has been detected. As discussed above, a threshold for detection may be determined, such that a minimal amount of contact, for a short period of time, may not trigger an indication of presence with respect to the bed frame. At the same time, contact with the bed frame for a longer period of time, as indicated by a large change in capacitance for a longer duration, may be associated with a determination of presence under and/or near the bed frame. In embodiments, detection of human contact with the frame, as indicated by peaks 178 and 180, may trigger a number of features associated with the adjustable bed, such as stopping of a lowering feature, alerting of an alarm feature, retracting of motion in an upward direction for a specified distance, or any combination of features programmed to activate in response to the appropriate trigger.

With reference to FIG. 24, capacitance detection 182 is shown on display 184 to demonstrate the amount of change in capacitance over time with respect to the frame of an adjustable bed, such as the adjustable bed frame monitored in FIG. 23. Display 184 includes the monitoring of a head portion 186 and a foot portion 188 of an adjustable bed. In embodiments, the rate of change area 190 is monitored as the capacitance changes from a first level of capacitance 192 to a second level of capacitance 194. Similarly, rate of change area 196 is monitored as the capacitance changes from a first level of capacitance 198 to a second level of capacitance 200. In embodiments, the rate of change in capacitance impacts whether the change itself triggers any feature of the automated bed. Accordingly, as indicated on the display 184, the rate of change area 190 and the rate of change area 196 indicate to a processor and/or controller that the rate of change in capacitance is occurring over too long of a time (i.e., is too slow) to trigger any of the features of the adjustable bed associated with lowering of the bed. For example, an algorithm that requires a minimum amount of change in capacitance before stopping lowering a bed (i.e. an algorithm that requires detection of the presence of human contact) may not be triggered by the change in capacitance caused by the movement of the bed itself, such as in FIG. 24.

As will be understood, a variety of filtering techniques may be used to adjust the determinations made (regarding whether presence is or is not detected) using software associated with the processor. For example, a variety of filters or transforms may be applied to the monitored capacitance signal to adjust/adapt the software for a particular application or user. For example, an automated bedding system could be adapted to adjust lighting or other functions based on particular amounts of change in capacitance over particular amounts of time, or trigger particular functions during particular times of day/night. As such, a processor may be trained to alter the sensitivity of a threshold based on previous use by a particular user of a corresponding feature. Additionally, a reaction time may be changed and a threshold may be adjusted for different users and different features of the automated bed.

Figure 25:
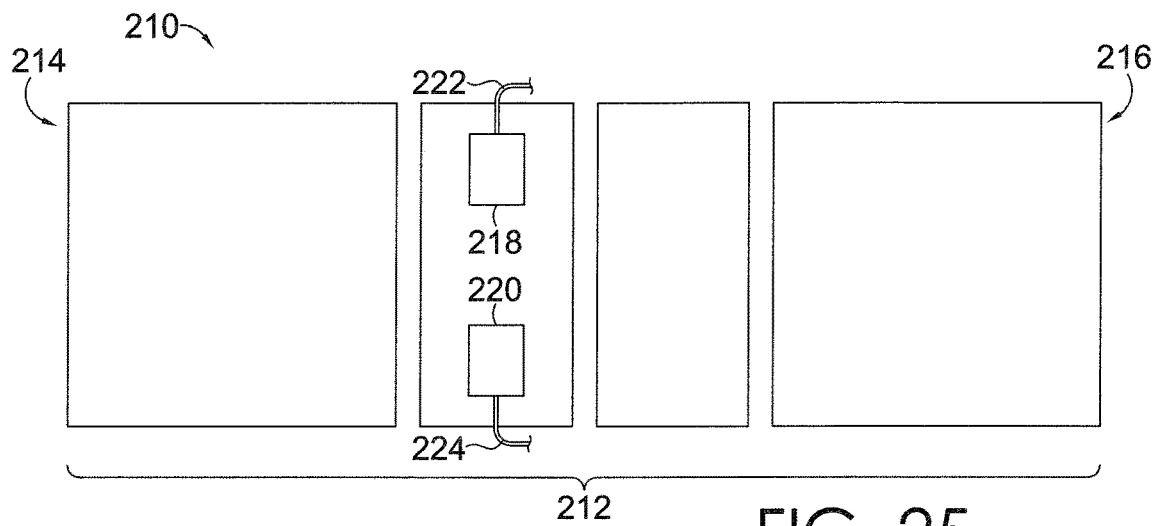
FIG. 25 is a top view of detection pads coupled to the panels of an automated bed platform, in accordance with embodiments of the invention.
Figure 26:
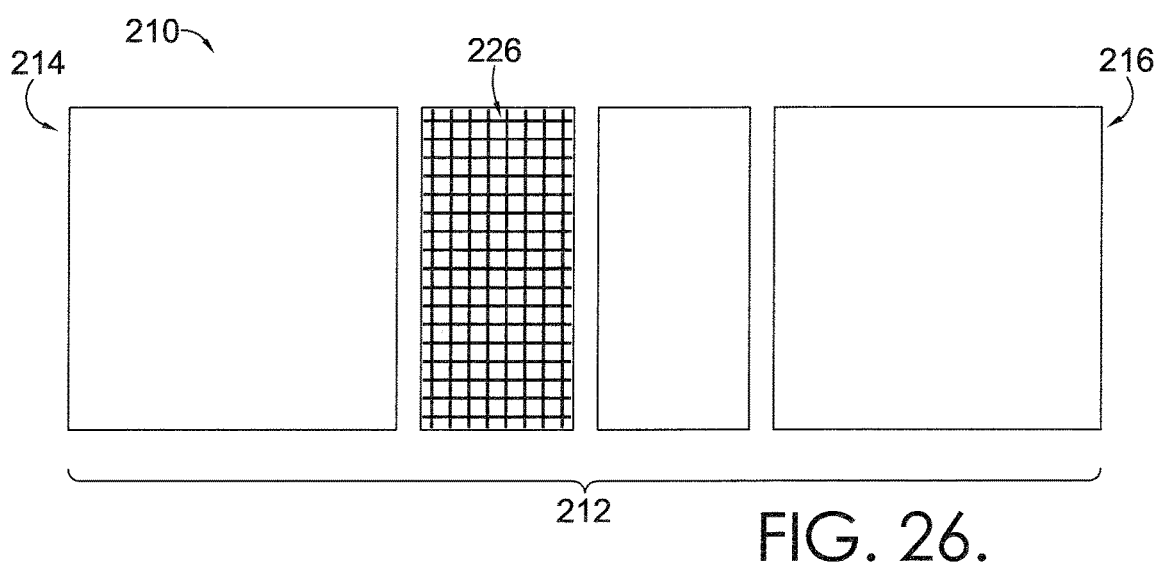
FIG. 26 is a top view of a detection grid coupled to the panels of an automated bed platform, in accordance with embodiments of the invention.
Figure 27:
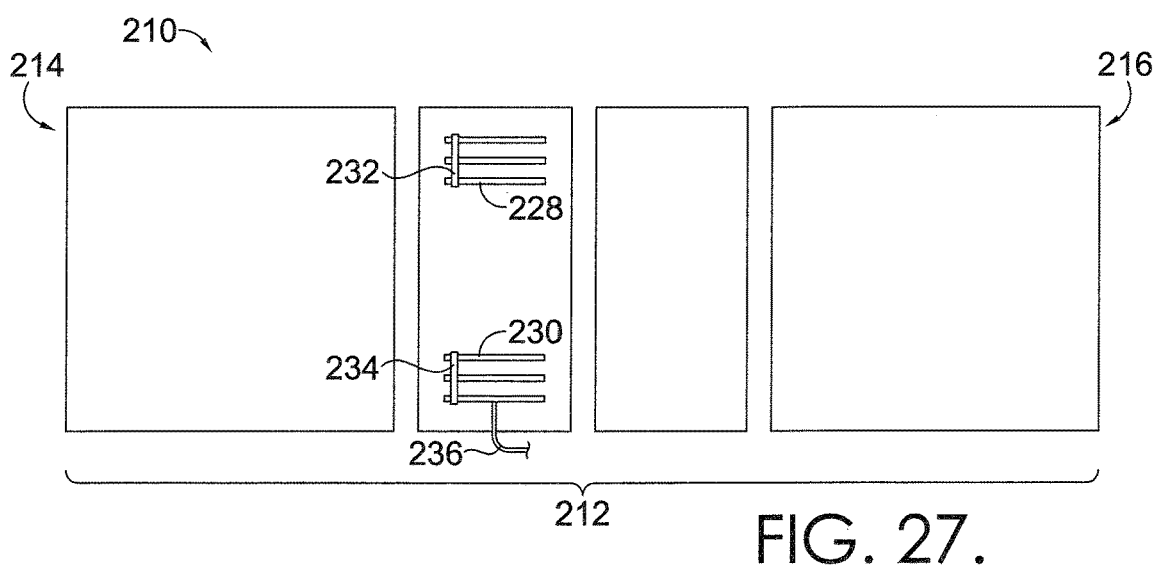
FIG. 27 is a top view of detection strips coupled to the panels of an automated bed platform, in accordance with embodiments of the invention.

An embodiment of an automated bedding system 210 with capacitive wire sensing is seen in FIGS. 25-27. Referring first to FIG. 25, a top view of the platform of the automated bedding system 210 includes a plurality of panels 212 having a first end 214 and a second end 216, detection pads 218 and 220 coupled to a surface of the plurality of panels 212, and cables 222 and 224 coupled to detection pads 218 and 220. In some embodiments, the first end 214 may be referred to as the "head" of the bed, while the second end 216 may be referred to as the "foot" of the bed.

When viewed from the top in FIG. 25, detection pads 218 and 220 are generally arranged near the first end 214 of the automated bedding system 210. In one embodiment, detection pads 218 and 220 are coupled to a stationary panel of the plurality of panels 212, which may be referred to as a "seatboard." As such, while the single panel supporting the head of the bed and the double panels supporting the foot of the bed may articulate up and down, the non-articulating seatboard may remain stationary. In one embodiment, while detection pads 218 and 220 are coupled to a static portion of an automated bedding system 210, an occupancy determination may be made with respect to one or more of the plurality of panels 212.

In some embodiments, detection pads 218 and 220 are a capacitive material, adapted to have a voltage based on proximity of an object to the detection pads 218 and 220. In further embodiments, the detection pads 218 and 220 are an aluminized polymer material with conductive properties. The aluminized polymer material of detection pads 218 and 220 may be conductive on one side only. In one embodiment, detection pads 218 and 220 are Mylar® pads. The capacitance measured across such conductive, aluminized polymer pads may be monitored by a processor that uses software to generate a determination of occupancy detection. In further embodiments, detection pads 218 and 220 may be aluminized Mylar®, aluminum sheets, metal screening, aluminum tape, a wire grid for a seat board, a metalized material or fabric, or any aluminized polymer material with conductive properties. In some embodiments, detection of occupancy the system activates one or more features and/or accessories via a control box and signal acting as a switch, using technologies such as Bluetooth, Wi-Fi, and Zigbee. In some embodiments, detection pads 218 and 220 have a single side that is conductive, and may be coupled to a bottom surface of an automated bedding system 210 platform, such as being sandwiched between stationary parts of an automated bedding system 210 during assembly.

In one embodiment, a Microchip® brand capacitive sensor may be used to determine when occupancy is detected. As such, while occupancy detection relies on the juxtaposition of a person or body with respect to one or both of the detection pads 218 and 220, a determination of the level of detection or the measurement of occupancy is conducted digitally, in software associated with the processor. In some embodiments, software associated with the occupancy detection system includes a software protocol that provides for seamless control of remote accessories associated with an automated bedding system.

As shown in FIG. 25, the capacitive detection pads 218 and 220 may be coupled to a control enclosure 218 coupled to the plurality of panels 212 of the automated bedding system 210. In some embodiments, cables 222 and 224 are coupled to the detection pads 218 and 220, and to a controlling device, such as a control enclosure/box. In embodiments, cables 222 and 224 are coaxial cables. As will be understood, additional capacitive components, such as additional detection pads, may be coupled to the plurality of panels 212. For example, while detection pads 218 and 220 may be coupled to a top surface of the plurality of panels 212, additional detection pads may be coupled to the bottom surface of the plurality of panels 212. Further, although depicted on a top surface of the plurality of panels 212, in some embodiments, detection pads 218 and 220 are coupled to any surface of the automated bedding system 210. For example, detection pads 218 and 220 may be coupled to a bottom surface of the plurality of panels 212 during assembly of an automated bedding system 210.

Detection pads 218 and 220 may be used to detect occupancy with respect to an automated bedding system 210. For example, as arranged near first end 214 of the automated bedding system 210, the torso of a person positioned on the top of the automated bedding system 210 may be detected by detection pads 218 and 220. In embodiments, detection pads 218 and 220 create a defined sensing area on the top half of the head of the bedding system 210, and are less susceptible to noise interference from articulation of the rest of the automated bedding system 210.

Referring next to FIG. 26, a top view of the platform of the automated bedding system 210 includes the plurality of panels 212 having a first end 214 and a second end 216, and a wire grid 226. Wire grid 226 may be coupled to a control enclosure/box for controlling the automated bedding system 210. In further embodiments, the wire grid 226 may be coupled to a controller that is external to the bedding system 210.

In some embodiments, wire grid 226 provides similar occupancy detection functionalities as the detection pads 218 and 220. Additionally, although depicted in FIG. 26 as being coupled to a particular portion of a top surface of the plurality of panels 212, in some embodiments, wire grid 226 may be coupled to any portion of the automated bedding system 210 for related detection purposes. In the embodiment of FIG. 26, wire grid 226 is made from a metallic detection material, such as an aluminized material or fabric, aluminized wire, or other metallic screen material. In one embodiment, the metallic screen material of wire grid 226 is interwoven to form a detection pad, such as detection pad 218 and 220 of FIG. 25.

Turning now to FIG. 27, a top view of the platform of the automated bedding system 210 includes a plurality of panels 212 having a first end 214 and a second end 216, a series of detection strips 228 and 230 coupled to the plurality of panels 212. The series of detection strips 228 and 230 are interconnected using connecting strips 232 and 234. In further embodiments, one or both of the series of detection strips 228 and 230 may be coupled to a control enclosure/box for controlling the automated bedding system 210, such as coupling detection strips 230 to a control enclosure using a cable 236. For example, cable 236 may be a coaxial cable coupling the series of detection strips 230 to a controller of the automated bedding system 210.

In some embodiments, a detection material associated with the automated bedding system 210 may be coupled to a top side of a plurality of panels 212 and/or a bottom side of the plurality of panels 212, and may be coupled directly to the deck of the automated bedding system 210 (i.e. to at least a portion of the plurality of panels 212). The detection materials depicted in FIGS. 25-27 as being coupled to the plurality of panels 212 may be arranged in any configuration for detection of occupancy. In some embodiments, non-conductive components of the automated bedding system 210 are in contact one or more of the sensors (i.e., detection strips 228 and 230, detection pads 218 and 220, and/or wire grid 226). In one example, a non-conductive control box may be coupled to one or more capacitive sensors.

Figure 28:
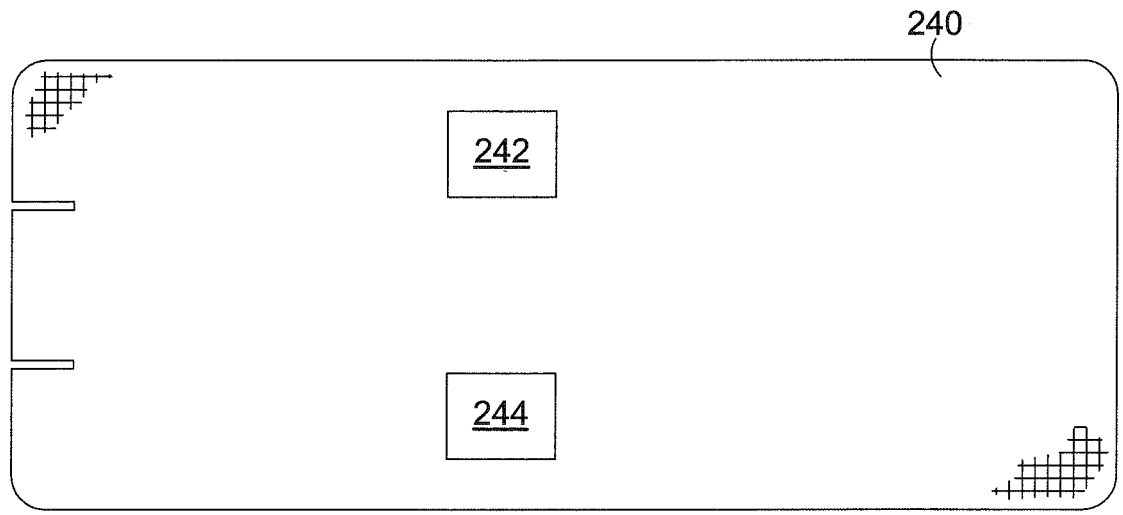
FIG. 28 is top view of detection pads coupled to a mattress topper material, in accordance with embodiments of the invention.
Figure 29:
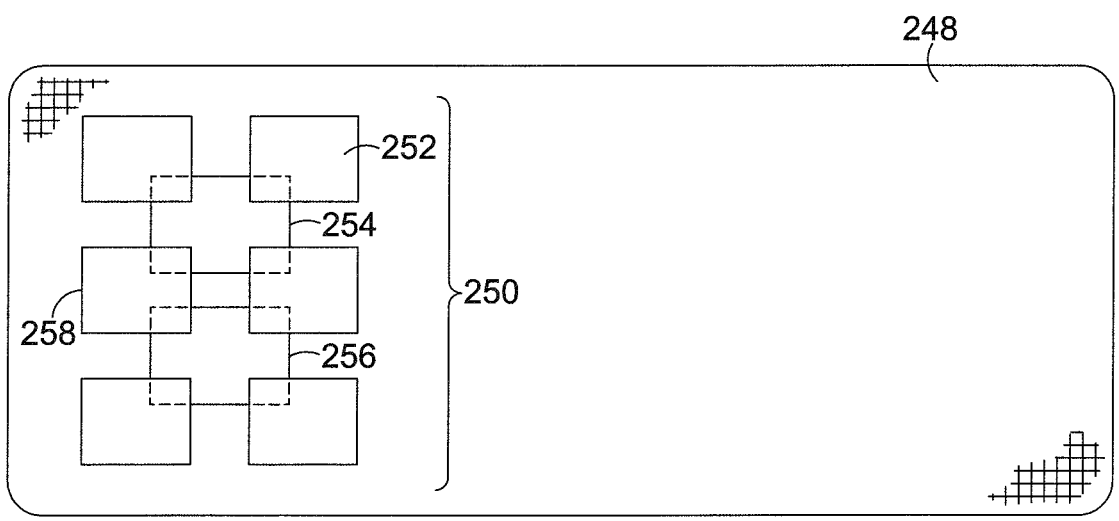
FIG. 29 is a top view of an array of detection pads coupled a mattress topper material, in accordance with embodiments of the invention.

With reference now to FIGS. 28 and 29, embodiments of an occupancy detection system include incorporating a detection material, such as one or more detection pads, into a mattress topper material of an automated mattress. In the example of FIG. 28, an automated bedding system 238 includes a mattress topper 240 having detection pads 242 and 244 incorporated into the material of the mattress topper 240. In one embodiment, the detection pads 242 and 244 are aluminized sections applied to the topper material of mattress topper 240. In further embodiments, mattress topper 240 is fused with a metallic material, and detection pads 242 and 244 are pre-applied, metalized areas on the surface of mattress topper 240.

As shown in the automated bedding system 246 of FIG. 29, and array 250 of multiple detection pads 252 may be coupled to a surface of a mattress topper 248. In embodiments, a detection pad 252 may be an aluminized polymer-material pad positioned on the mattress topper 248 with a conductive side facing upward, and arranged in a variety of positions. In further embodiments, detection pads 252 may be overlapped, arranged on left and/or right sides of a mattress topper 248, or otherwise configured to provide an area of detection with respect to the automated bedding system 246. In one embodiment, a plurality of detection pads 252 are arranged in an array 250 configuration such that a position of a single occupant of a bed can be located.

For example, detection pads 252 in FIG. 29 may be aluminized, polymer-material panels placed in an array 250 to determine an occupant's position, by overlapping with detection pads 254 and 256. In one example, a detection pad 258 is coupled to and/or overlaps with both detection pads 254 and 256, and is positioned in the middle of the array 250 to detect occupancy with respect to both sides of a mattress (e.g., a first occupant lying on a left side of a bed, and a second occupant lying on a right side of a bed, with the heads of each occupant hear the first end 214). In some embodiments, a non-conductive material may be used to arrange the array 250, and can be coupled directly or indirectly to the aluminized polymer material of detection pads 252, 254, 256, and 258.

In one embodiment of the invention, an aluminized, polymer detection material may be tied directly to a helical spring of an automated bedding system for detection. For example, a detection material may be coupled to an innerspring unit of an automated bedding system, to create a single sensor from the combined detection of each spring in the innerspring unit. In another embodiment, individual pocket coils of a mattress could become individual occupancy detectors as the coils are insulated from one another. As such, the pocket coils could serve as an array of individual sensors. In some embodiments of the invention, capacitive detectors such as aluminized polymer pads may be used with an automated bedding system mattress that includes pocket coils, memory foam, and/or air. For example, two or more aluminized polymer material sensors may be coupled to a platform of an automated bedding system to generate at least two distinct zones of detection with respect to be bed. In some embodiments, aluminized polymer material sensors and/or pocket coils could be used to identify multiple, individual areas and/or zones on a bed for detection of occupancy.

Various embodiments of the invention utilize the occupancy detection systems of FIGS. 25-29 for determining occupancy of an automated bedding system, and for triggering and/or activating one or more controls and/or features associated with the automated bedding system. For example, one or more Mylar® detection pads may be used to determine when an occupant exits a bed, which may trigger one or more commands associated with the bed, such as turning on a light on that occupant's side of the bed. As such, the underbed lighting on a first user's side of a bed may be illuminated based on detection of that first user exiting the bed.

The features triggered by changes in occupancy detection may be dependent on the time of day during of the occupancy determination. For example, upon determining a change in occupancy at a particular time of night (i.e. a determination that a user has exited a bed in the middle of the night) may trigger the turning on of lights associated with a bathroom, such as a light in the bathroom and/or a series of lights along a path to the bathroom. In further embodiments, a change in occupancy detection may trigger one or more features associated with a remote controller of an automated bed. For example, an occupancy change may trigger an alarm to chime, which could turn on one or more lights in response to triggering the remote. In further embodiments, features that are activated/triggered by a change in occupancy detection (such as a detection panel sensing the absence of a person) could be deactivated and/or timed out after a particular amount of time. In another embodiment, a snooze feature may be incorporated into the detection system such that an occupancy detection that triggers a particular feature of the automated bedding system may be postponed and/or delayed.

In one embodiment of the invention, the occupancy detection system may be provided for use with a non-adjustable bed, such as a child's bed. As such, a detection pad, detection grid, and/or detection strip feature discussed in FIGS. 25-29 may be incorporated into a non-adjustable bed. In one embodiment, the occupancy detection system may be provided as a kit for incorporating into an existing, non-adjustable bed. The system may be used to detect occupancy with respect to the non-adjustable bed, such as alarming if a child gets out of bed, by chiming a bed remote and/or causing a light to come on in a room. In one embodiment of the invention, depending on a time of night when the change in occupancy detection is sensed, one or more features of the bed system may be triggered, such as turning on lights to a child's bathroom, etc.

In embodiments of the invention, occupancy detection triggers both activation and deactivation of features associated with a bed. For example, an occupancy detection system may determine that a person has entered a bed, which may trigger the system to turn off the lights in the room. Accordingly, in one embodiment, a first change in occupancy determination (a user exiting a bed) may trigger lights to be turned on in a room, while a second change in occupancy determination (a user returning to bed) may trigger the lights to turn back off. In some embodiments, lights may be dimmed upon sensing a user getting into bed, timed to turn off after a particular amount of time passes after occupancy is detected, and/or dimmed to dark upon occupancy detection. For example, lights may be dimmed to dark upon detection of an occupant returning to bed.

Further embodiments of the invention include coordinating of additional features associated with the occupancy detection system, such as a home alarm system that may be set and/or turned on based on detecting that a person has gotten into bed. In further embodiments, the home alarm system may be deactivated upon the person exiting the bed. In yet another example, exterior lights of a house may be turned on based on detecting a user exiting the bed, such as a front porch light turning on when a user exits the bed in the middle of the night.

In one embodiment, the occupancy detection system may be used in a home care situation for an elderly or disabled individual. Accordingly, the system may be programmed to trigger certain alarms when the elderly or disabled person gets out of bed, such as by chiming a remote and/or alarm feature of the occupancy detection system. In another embodiment, various features of a user's home may be coordinated to operate in response to determinations by the occupancy detection system. For example, if the occupancy detection system determines that a user is in bed, the home environment system (i.e. the Heating, Ventilation and Air Conditioning (HVAC) system) may be adjusted to a user-specified night setting. Similarly, if the occupancy detection system determines that a user has exited a bed, such as determining that a detection pad no longer senses the presence of the occupant, then the HVAC system may be triggered to change to daytime settings.

In some embodiments of the invention, the occupancy detection system may be incorporated into a variety of other household devices, other than a bed or bedding system. For example, an occupancy detection system may be incorporated into a door mat, an area rug, and/or a stairway of a home for indication of occupancy presence. For example, in one embodiment, the occupancy detection system may be incorporated into a runner on a basement stairway. Based on a determination of occupancy, the system may trigger an audible alarm to alert that presence is detected, such as alerting a warning signal when a child's presence is detected near basement stairs.

Figure 30:
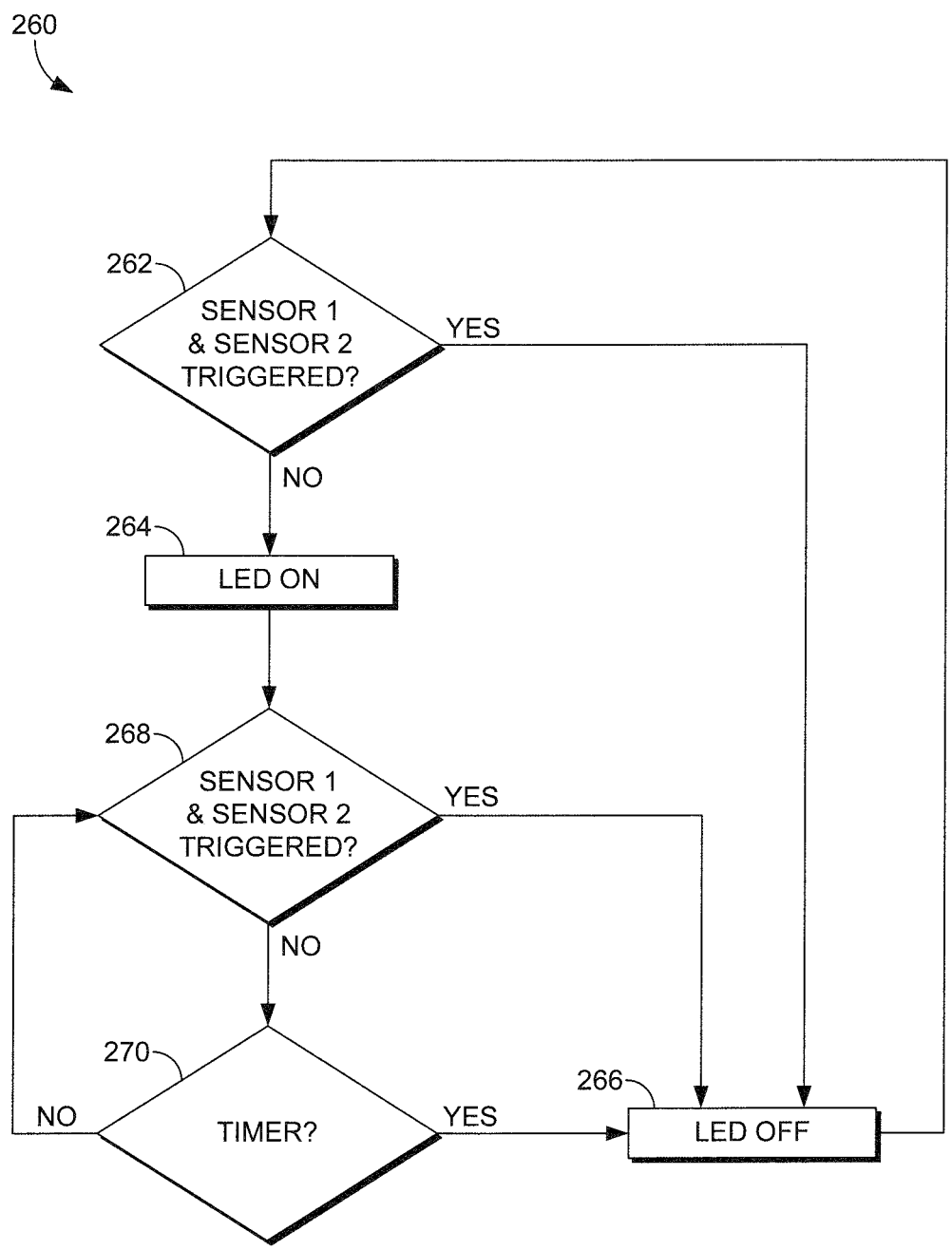
FIG. 30 is a flow diagram of an exemplary method of detecting occupancy with respect to a bed, in accordance with embodiments of the invention.

Having described various embodiments of detection using the occupancy detection system, exemplary methods for implementing the occupancy detection system are discussed with reference to FIGS. 30-32. In particular, FIG. 30 is flow diagram 260 of an exemplary dual-sensor method of detecting dual occupancy with respect to an adjustable bed. At block 262, a determination is made whether a first sensor and a second sensor have been triggered. For example, software executed by the system may determine whether both occupants of a bed are present, having a sensor associated with a potential position of each occupant. If both of the sensors have not been triggered, at block 264, an LED may remain on. For example, if both occupants have not gotten into bed yet, LED under-bed lighting may remain lit. Alternatively, if sensor 1 and sensor 2 have been triggered, at block 266, an LED may be turned off. For example, in FIG. 25, if detection pads 218 and 220 are both triggered to indicate presence of two individuals in the automated bedding system 210, then a determination may be made to turn off the lights in a room, such as an under-bed lighting feature of a bed.

At block 268, the occupancy detection system continues to check whether the first and second sensors have been triggered. If the sensors have not been triggered, at block 270, a timer may be initiated to turn off the light at block 266 after a specified interval of time has passed. In other words, the system will not wait all night for both occupants to get into bed before turning off the lights. Alternatively, if a timer is not initiated, the method returns to block 268 where the system continues to check for a triggering of the first and second sensors before turning off the LED. In one embodiment, a user may indicate bed system that only one occupant is present, which may permit the system to only require detection from a single sensor before turning off the lights.

Figure 31:
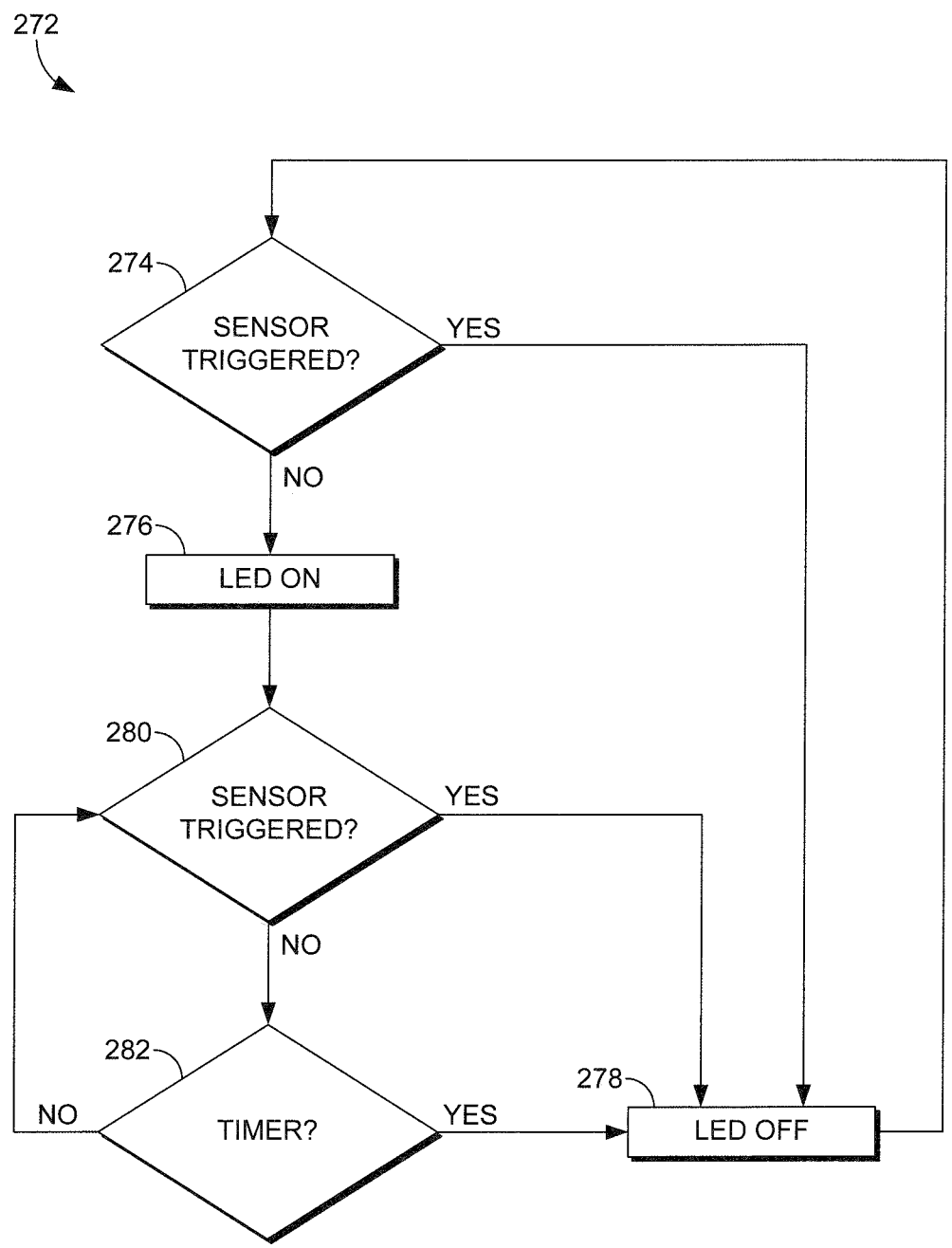
FIG. 31 is a flow diagram of an exemplary method of detecting occupancy with respect to a bed, in accordance with embodiments of the invention.

Turning now to FIG. 31, a flow diagram 272 of an exemplary single-sensor method of detecting occupancy with respect to a bed is provided. At block 274, a determination is made whether a sensor has been triggered. At block, 276, if the sensor has not been triggered, the LED remains on. For example, if a sensor of an automated bed has not determined that an occupant has entered the bed, then underbed, LED lighting may remain on to illuminate a path to the bed. However, if the sensor is triggered at block 274, then the LED is turned off at block 278 (e.g., the occupant gets into bed and triggers the sensor). Having left the LED on at block 276, a determination is made at block 280 as to whether the sensor is subsequently triggered. If the sensor has been triggered, the LED is turned off at block 278. If the sensor has not been triggered, at block 282, a timer may be initiated to determine when a threshold amount of time has passed. After an amount of time has passed, the timer may trigger the LED to turn off at block 278. Alternatively, upon not satisfying the threshold of time by the timer at block 282, the method may return to block 280 to make a determination of whether the sensor has been triggered.

Figure 32:
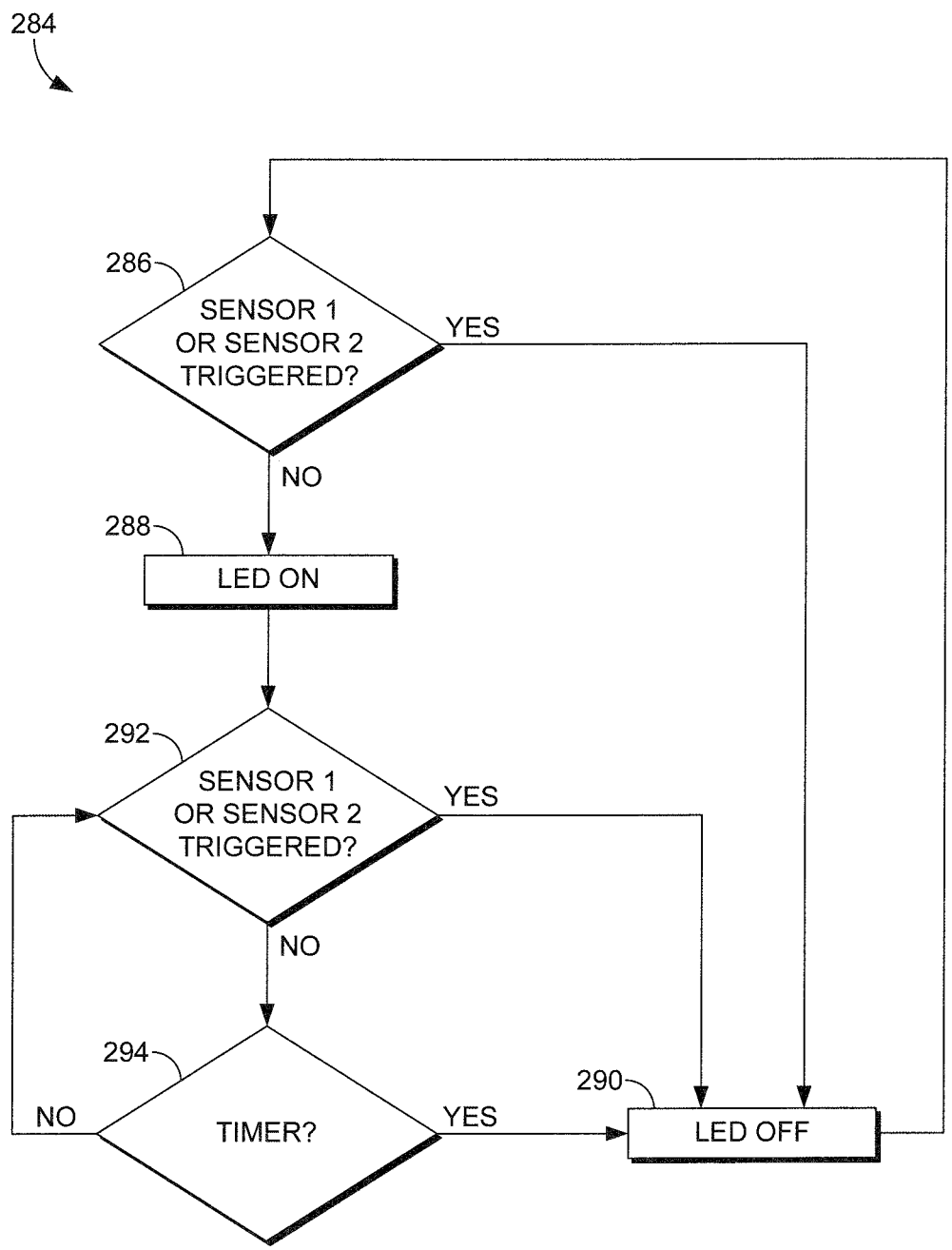
FIG. 32 is a flow diagram of an exemplary method of detecting occupancy with respect to a bed, in accordance with embodiments of the invention.

With reference finally to FIG. 32, a flow diagram 284 of an exemplary dual-sensor method of detecting single occupancy with respect to a bed is provided. At block 286, a determination is made whether a first sensor or a second sensor has been triggered. For example, a bed may have two (or more) sensors that define at least two distinct areas of the bed for detection. If neither of the sensors has been triggered, at block 288, an LED may remain on. Alternatively, if sensor 1 or sensor 2 has been triggered, at block 290, an LED may be turned off. For example, if one of two sensors is triggered, underbed LED lights may be turned off. In another example, as depicted in FIG. 25, if detection pad 218 or detection pad 220 is triggered to indicate presence of a body in the automated bedding system 210, then a determination may be made to turn off the lights in a room.

At block 292, the occupancy detection system continues to check whether the first or second sensor has been triggered. If neither sensor has been triggered, at block 294, a timer may be initiated to turn off the light at block 290 after a specified interval of time has passed. Alternatively, if a timer is not initiated, the method returns to block 292 where the system continues to check for a triggering of the first and second sensors before turning off the LED.

As will be understood, although the examples of FIGS. 30-32 refer to triggering of sensors corresponding to turning an LED light on and off, various embodiments of the invention may trigger additional and/or alternative features associated with an automated bedding system. In other words, although examples of triggering lighting are discussed (in particular, under-bed mounted LED lighting), other features such as a bathroom light, a bedroom fan, house lights, etc., may be triggered by an occupancy determination with respect to a bed. Additionally, the software associated with embodiments of the system may be customized to a particular system in that both single-occupant and dual-occupant features may be adjusted to respond differently to various triggering events.

Accordingly, in a single-occupant embodiment, undermount LED lighting on an adjustable bed may remain on if the user/occupant is not present, and may be turned off once the occupant is detected. In one embodiment of a dual-occupant detection system, the software associated with the sensors may be programmed such that the presence of both users is required before a feature is activated/altered (e.g., both occupants must be present in the bed before the lights will turn off). In another embodiment of a dual-occupant detection system, the system may require that at least one user is present before the lights can be turned off. Further, once the first occupant is present, the system may automatically trigger a timer for turning off the lights without requiring the second occupant to be present in the bed (i.e. a first occupant need not sleep with the lights on all night). However, if the second occupant enters the bed before the timer is complete, the triggering of the second sensor may initiate turning off the lights (without requiring the system to fulfill the entire timer waiting period).

In one embodiment of the invention, a single-occupant system may utilize two sensors for detecting occupancy in an automated bed. The first sensor may make a determination of presence of an occupant in the bed, thereby triggering the turning off of bed lighting (or other associated bed features) without requiring the second sensor to be triggered. As the occupant sleeps, the occupant may shift away from an area of capacitance associated with the first sensor, no longer triggering the first sensor. For example, the occupant may roll from one side of the bed to another. In embodiments, the software of the system may be programmed to allow an amount of delay (i.e. to wait a threshold amount of time) after the first sensor no longer senses an occupant, before triggering an associated feature (e.g. before turning on lights because an occupant has left one side of the bed). If the second sensor detects the occupant within the delay period of time (i.e. before the threshold amount of time expires), then the bed may continue to function as if an occupant's presence has been maintained. In other words, if the first sensor no longer senses the occupant, but the second sensor detects the occupant within a specified amount of time, the lights need not be turned on because the occupant has just moved from one side of the bed to the other.

In one embodiment, a dual-occupant system may be programmed to permit certain features to be triggered that would otherwise inactive with a single-sensory system. For example, in an automated bed system with two sensors, a first occupant may trigger a first sensor and a second occupant may trigger a second sensor. With both sensors triggered, the system may be programmed to turn off the lights associated with the bed (e.g. the underbed LED lighting). If the first occupant exits the bed, underbed lighting may be activated. For example, one occupant may exit the bed to use the restroom in the middle of the night, and lighting may be illuminated even though the second occupant is still present in the bed. In some embodiments, features such as underbed lighting may be occupant-specific, such as underbed lighting only illuminating on the side of the bed associated with the first occupant and/or first sensor.

In some embodiments, underbed lighting features associated with an automated bedding system may include photocell light technology. Accordingly, the underbed lighting may not illuminate until night. As such, in some embodiments, the lights will remain on as long as the room is dark (i.e., it is night) and no occupant is present in the bed (i.e., occupant detection is not sensed according to embodiments of the invention).

In embodiments of the invention, the detection material of the detection pads, wire grid, and/or detection strips and the metalized areas of the mattress topper material are adapted to have a voltage based on proximity of an object to the detection material or metalized area. Such voltage information is collected via the detection material and received by a processor, which determines when a change in voltage satisfies a threshold. Once a particular change in capacitance satisfies a threshold, a corresponding function associated with the automated bed may be initiated. In embodiments, a threshold for initiating a corresponding function includes a particular amount of change in voltage within a particular amount of time. For example, when using capacitance information to turn lights on/off, a particular amount of change in voltage may be required during a particular amount of time before satisfying the threshold indicating that a person has exited the bed (and before the lights may be turned on). Similarly, a particular threshold value of voltage change may be required by the processor, over a particular amount of time, before making a determination that a person has re-entered the bed (and before the lights can be turned off again). In embodiments, a processor continuously receives capacitance monitoring information, and monitors how quickly a change in capacitance occurs (how quickly the delta changes) to determine if a big enough change has occurred in a certain amount of time to satisfy a threshold, and trigger the corresponding function. Accordingly, based on satisfying a particular threshold, various features associated with the automated bedding system 210 may be activated and/or enabled.

Figure 33:
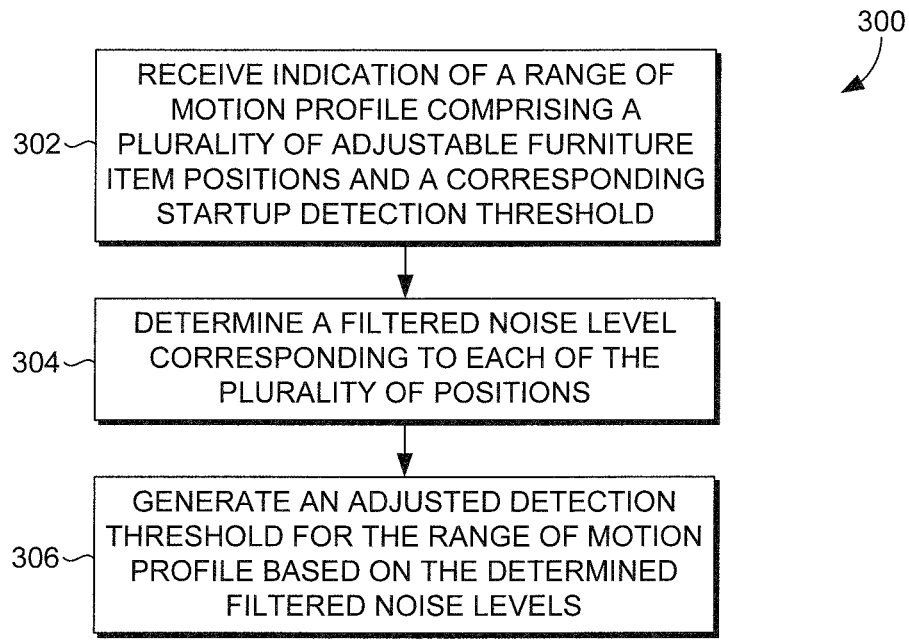
FIG. 33 is a flow diagram of an exemplary method for characterizing an occupancy detection system, in accordance with embodiments of the invention.

With reference now to FIG. 33, a flow diagram 300 of an exemplary method for characterizing an occupancy detection system is provided in accordance with embodiments of the invention. At block 302, an indication of a range of motion profile is received. The range of motion profile may include a plurality of adjustable furniture item positions, such as positions of an automated furniture item as manipulated by a user and/or positions associated with occupancy detection as part of an occupancy detection system. Additionally, the range of motion profile includes corresponding startup detection thresholds for each of the plurality of adjustable furniture item positions. Such startup detection thresholds may include, in some embodiments, a capacitive detection threshold for determining a change in occupancy with respect to a particular position of the furniture item. As such, the received indication of a range of motion profile for a particular automated furniture item may include a plurality of positions that a user may experience while manipulating the automated furniture item, as well as a plurality of startup detection thresholds that establish a baseline expected change in capacitance for triggering an occupancy indication.

At block 304, a filtered noise level is determined, which corresponds to each of the plurality of positions. In one embodiment, the noise level associated with each of the positions of the range of motion profile are received sequentially by running the automated furniture item through a complete cycle and/or range of motion. In one aspect, the noise level associated with each position throughout the range of motion of the automated furniture item is determined and compared to the corresponding startup detection threshold. As such, at block 306, and adjusted detection threshold is generated for the range of motion profile based on the determined filtered noise levels. In some aspects, a first position of the automated furniture item may cause little to no interference with the occupancy detection capabilities of a detection system. As such, the startup detection threshold corresponding to that first position may maintain its original detection threshold as its adjusted detection threshold. In other words, the amount of change in capacitance may remain the same as the detection threshold and baseline level of detection remain consistent with the startup values. By contrast, in another example, a second position of an automated furniture item and/or series of positions of the automated furniture item (while approaching or returning from a particular position) may generate additional noise that results in the determination of an amount of noise to be filtered for that second position, and the determination of an adjusted detection threshold for determining occupancy during articulation to and/or through that position in the range of motion.

Figure 34:
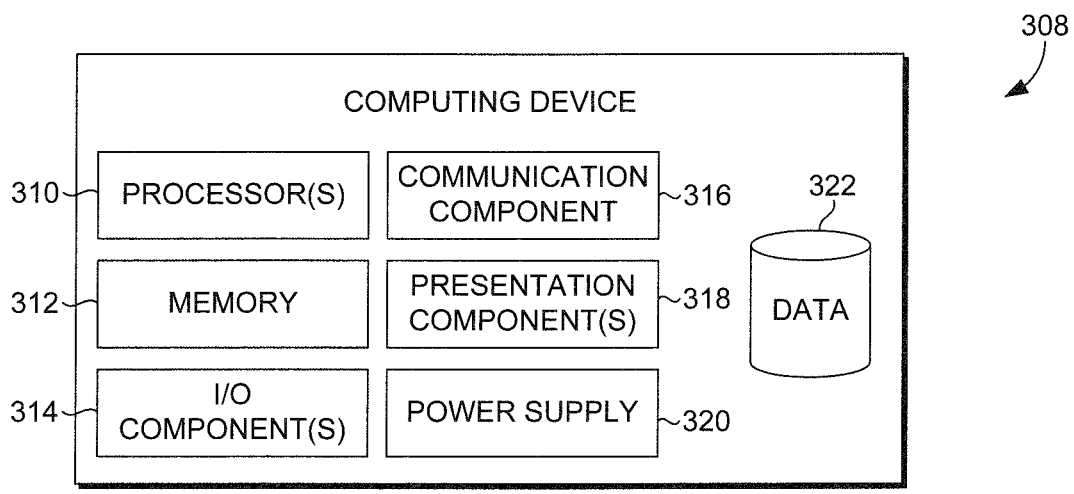
FIG. 34 is an exemplary computing device for use with embodiments of the invention.

In FIG. 34, an exemplary computing device 308 for use with embodiments of the invention includes a processor 310, a memory 312, input/output components 314, a communication component 316, presentation components 318, a power supply 320, and a database 322. Various components, in addition to or in alternative to those depicted in association with the exemplary computing device 308 may be utilized during characterization and/or calibration for occupancy detection, according to embodiments of the invention.

The perspective view of the position profile characterization 324 in FIG. 35 includes an exemplary mattress 28 in a first position 326, as controllable by an adjustable bed frame 114 supporting the mattress 28, having a first end 14 opposite a second end 16. In embodiments, the first position 326 represents a single position in the range of motion profile for a particular automated furniture item, such as a bed. The graphical depiction of first position characterization 328 includes a baseline 330, a noise level 332, and a startup detection threshold 334. Based on a minimum noise level 332, the detection threshold 334 remains the same for the first position 326, in one embodiment.

In FIG. 36, the position profile characterization 336 includes the mattress 28 in a second position 340 having a raised head 338, as controllable by the adjustable bed frame 114 supporting the mattress 28. In embodiments, the second position 340 represents a single position in the range of motion profile for a particular automated furniture item, such as a bed. The graphical depiction of second position characterization 342 includes a baseline 330, a noise level 344, a startup detection threshold 334, an adjusted baseline 346, and an adjusted threshold 348. In this example, the detected noise level 344 resulted in a determination that the baseline for detection during and/or near the second position 340 is actually above the original baseline 330, and instead is moved to the adjusted baseline 346. As such, an indication of no change in capacitance, and therefore no change in occupancy with respect to the mattress 28 when in the second position 340, is calibrated to correspond to an amount of noise 344 generated by the raised head 338. Additionally, to trigger a change in capacitance that indicates a change in occupancy, the change in capacitance must now exceed the adjusted threshold 348 before triggering an occupancy indication with respect to the adjusted baseline 346.

In FIG. 37, the position profile characterization 350 includes the mattress 28 in a third position 354 having a raised foot 352, as controllable by the adjustable bed frame 114 supporting the mattress 28. In embodiments, the third position 354 represents a single position in the range of motion profile for the particular automated furniture item. The graphical depiction of the third position characterization 356 includes a baseline 330, a noise level 358, a startup detection threshold 334, an adjusted baseline 360, and an adjusted threshold 362. In this example, the detected noise level 358 resulted in a determination that the baseline for detection during and/o near the third position 354 is actually above the original baseline 330, and instead is moved to the adjusted baseline 360. As such, an indication of no change in capacitance, and therefore no change in occupancy with respect to the mattress 28 when in the third position 354, is calibrated to correspond to an amount of noise 358 generated by the raised foot 352. Additionally, to trigger a change in capacitance that indicates a change in occupancy, the change in capacitance must now exceed the adjusted threshold 362 before triggering an occupancy detection with respect to the adjusted baseline 360.

In FIG. 38, the position profile characterization 364 includes the mattress 28 in a fourth position 366 having a raised head 338 and a raised foot 352, as controllable by the adjustable bed frame 114 supporting the mattress 28. In embodiments, the fourth position 366 represents a single position in the range of motion profile for the particular automated furniture item. The graphical depiction of the third position characterization 367 includes a baseline 330, a noise level 369, a startup detection threshold 348, an adjusted baseline 368, and an adjusted threshold 370. In this example, the detected noise level 369 resulted in determination that the baseline for detection during and/or near the fourth position 366 is actually above the original baseline 330, and instead is moved to the adjusted baseline 368. As such, an indication of no change in capacitance, and therefore no change in occupancy with respect to the mattress 28 when in the fourth position 366, is calibrated to correspond to an amount of noise 369 generated by the raised head 338 and the raised foot 352. Additionally, to trigger a change in capacitance that indicates a change in occupancy, the change in capacitance must now exceed the adjusted threshold 370 before triggering an occupancy detection with respect to the adjusted baseline 368.

Figure 39:
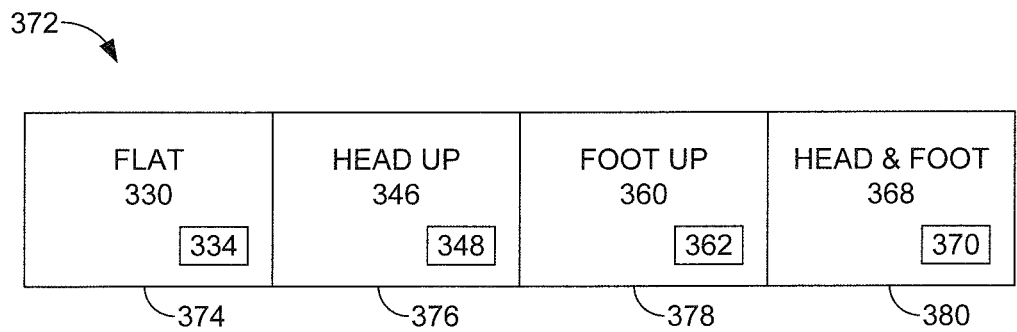
FIG. 39 is an exemplary system diagram for position profile characterization, in accordance with embodiments of the invention.

Turning next to FIG. 39, an exemplary system diagram for position profile characterization 372 is provided in accordance with embodiments of the invention. The position profile characterization 372 includes, in one embodiment, a range of motion characterized by a first profile phase 374, a second profile phase 376, a third profile phase 378, and a fourth profile phase 380. During each phase of the profile characterization 372, as discussed above, a particular position is associated with a detection threshold corresponding to the particular position within the range of motion. As such, each position of the automated furniture item is monitored during characterization to determine an accurate limit for occupancy detection. In one embodiment, profile characterization 372 includes a flat position 330 with a detection threshold 334, a head up position 346 with an adjusted detection threshold 348, a foot up position 360 with an adjusted detection threshold 362, and a head and foot up position 368 with an adjusted detection threshold 370. As will be understood, during calibration throughout an entire range of motion of an automated furniture item, varying numbers of positions may be included in the various profile phases. Additionally, individual positions may be characterized at different phases of travel, such as a characterization of a head approaching a head up position 346, and a characterization of a head returning back down from a head up position 346. Similarly, a full range of motion profile may be characterized to adjust detection thresholds for intermediate positions of an automated furniture item, such as transition positions between multiple specified positions of the automated furniture item. Such intermediate positions may also be characterized such that a baseline detection level and corresponding threshold for capacitance detection may be adjusted. In further aspects, based on determining an adjusted detection threshold 348 throughout a range of motion of an automated furniture item, the control component of the automated furniture item and/or occupancy detection system associated with the automated furniture item may automatically adjust one or more detection thresholds throughout a range of motion to prevent "false" readings of occupancy attributed to noise. Further, such "false" readings of occupancy may refer to false indications of a change in occupancy during articulation of the automated furniture item based on a level of noise interfering with the baseline and threshold comparison throughout the phases of motion.

Figure 40:
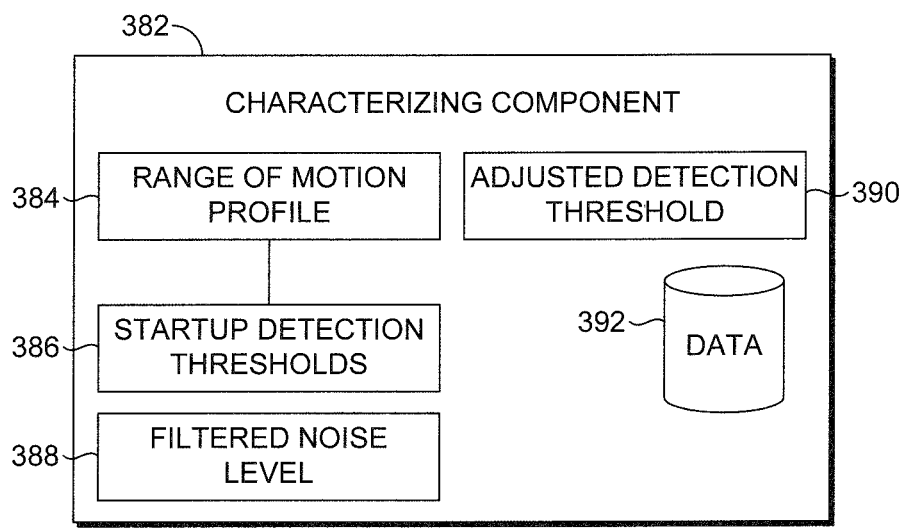
FIG. 40 is an exemplary system diagram of a characterizing component, in accordance with embodiments of the invention.

Accordingly, with reference finally to FIG. 40, an exemplary system diagram of a characterizing component 382 is provided in accordance with embodiments of the invention. The characterizing component 382 may be incorporated into one or more features of a control component of an automated furniture item, and need not be provided as a separate component. Instead, in some embodiments, the features of the characterizing component 382 may be automatically performed during a particular phase of use of an automated furniture item, such as an initial startup phase. In the example of FIG. 40, the characterizing component 382 includes a range of motion profile component 384, a startup detection thresholds component 386, a filtered noise level component 388, an adjusted detection threshold 390, and a database 392. In some embodiments, one or more features of the characterization component 382 may be utilized by a control component of an automated furniture item, and the results of such characterization may be stored for subsequent determinations of occupancy with respect to one or more adjusted detection thresholds and baselines, such as the database 392. In one aspect, a characterization profile may be processed with respect to an automated furniture item upon initial setup, or upon user prompt for a subsequent characterization. For example, upon relocating an automated furniture item from one location to another, a user may desire to run a characterization of the baseline and threshold detection levels throughout the range of motion, to account for any changes in the noise level affecting such baseline and threshold levels.

Turning next to FIG. 41, an exemplary system perspective view of a furniture item 4102 and a graphical depiction 4110 representing a noise associated with an environment of the furniture item 4102 is provided in accordance with embodiments. As mentioned above, features associated with the furniture item 4102 may detect an indication of a presence and/or occupancy of the furniture item 4102 (also referred to as a sensing feature). For example, presence and occupancy may be detected by determining a change in capacitance and/or voltage utilizing one or more sensors (such as the capacitance elements and/or sensors described above) associated with the furniture item 4102. This can then be used to determine human presence near the furniture item 4102 and/or occupancy of the furniture item 4102. It should be appreciated that while FIG. 41 depicts the furniture item 4102 as a bed, this is only an exemplary furniture item as any and all furniture items may be used, including a chair, a sofa, an ottoman, etc.

In embodiments, the noise associated with the environment of the furniture item 4102 may interfere with the one or more sensing features of the furniture item 4102, rendering them inaccurate. As used herein, environmental noise generally refers to capacitance and/or voltage measurements detected by one or more sensors based on the environment of the furniture item 4102. Additionally or alternatively, environmental noise can interfere with sensing features and/or detection features of the furniture item 4102 based on affecting the measurements by the one or more sensors associated with the furniture item 4102. For example, the environmental noise may interfere or affect the measurements by one or more sensors because of changes in the environment. That is, based on the environment in which the furniture item 4102 is located, any changes in the environment may produce an environmental noise that rises to such a level that it exceeds a threshold for the one or more sensing features of the furniture item 4102, leading to a false indication of presence or occupancy even though no one is near the furniture item 4102. Alternatively, the environmental noise may decrease to a degree that despite something or someone being present or occupying the furniture item 4102, a threshold for the one or more sensing features is not triggered. This can render the sensing features of the furniture item 4102 inaccurate or ineffective.

The environmental noise may thus impact the safety and/or benefits of the one or more sensing features of the furniture item 4102. For example, the environmental noise may impact features relating to presence detection, which may impact any safety features that could be triggered as a result of an indication of presence under the furniture item 4102. As a further example, the noise associated with the environment might be so low that, even though human presence should be detected beneath the furniture item 4102 to stop an articulation or movement of the furniture item 4102, the reduced noise prevents a threshold capacitance from being met. The problem of environmental noise may further be compounded by the fact that the capacitance sensors used in sensing features associated with the furniture item 4102 may be so sensitive and so accurate at detecting changes in voltages and/or capacitance that even the slightest changes in the environment may affect the determinations based measurements by the one or more sensors (e.g., indication of presence and/or occupancy).

Environmental noise may come from a variety of sources. For example, environmental noise may come from electronic sources, such as motors, transmitters, dimmer circuits, electrical wiring in the walls, television sets, lamps, etc. These electronic sources may impact the environment in which the furniture item 4102 is located because they may introduce a change in voltage and/or capacitance that is detectable by the one or more capacitance sensors. This in turn could affect one or more sensing features of the furniture item 4102 that also rely on measuring voltage and/or capacitance.

For instance, referring now to FIG. 42, an exemplary system perspective view of the furniture item 4102 and the graphical depiction 4260 representing a noise associated with an environment of the furniture item 4102 is provided in accordance with embodiments. As shown, a lamp 4202 located proximate the furniture item 4102 may introduce noise into the environment of the furniture item 4102. This is illustrated by the change in noise level from a first baseline noise level 4130 to a second baseline noise level 4240.

Additionally or alternatively, environmental noise may be introduced based on non-electronic sources, such as metal objects, other furniture items, and the like. For instance, other furniture items including chairs, sofas, beds, coffee tables, and the like may affect the noise associated with the environment of the furniture item 4102 as they too can impact the measurements of the one or more sensors associated with the furniture item 4102.

Additionally or alternatively, environmental noise may be introduced based on changes in the atmosphere. For example, the one or more sensors may be so sensitive that even atmospheric changes, such as changes in temperature and humidity, may introduce environmental noise. Any and all aspects or combinations thereof is contemplated herein.

The environment of the furniture item 4102 may generally be defined as any area within range of the one or more sensors associated with the furniture item 4102. For example, the environment may include a room in which the furniture item 4102 is placed. Additionally or alternatively, the environment may include multiple rooms and/or the walls separating rooms. All areas in which environmental noise affects the measurements by one or more sensors associated with the furniture item 4102 is contemplated as the environment of the furniture item.

With reference to FIGS. 41 and 42, the noise associated with the environment of the furniture item 4102 may change over time, creating a series of noise states. The noise (also referred to as a noise level) may increase and/or decrease as there are changes in the environment. For example, FIG. 41 illustrates a first noise state having the first noise level 4120 in accordance with embodiments herein. As illustrated in FIG. 42, the first noise state may increase to a second noise state having a second noise level 4240 based on changes of the environment in which the furniture item 4102 is located. For example, as mentioned, the environmental changes may come from introducing a lamp 4202 into the environment of the furniture item 4102.

As such, in embodiments, the environmental noise may increase over time such that the first noise state associated with the environment of the furniture item 4102 increases to a higher second noise state. Additionally or alternatively, the environmental noise may decrease over time such that the first noise state associated with the environment of the furniture item 4102 may be decreased to a lower second noise state. The noise states can then be filtered to so as to determine a first baseline noise level 4130 and a second baseline noise level 4240, as illustrated in FIGS. 41 and 42. As discussed in more detail below, the changes in noise state over time (i.e., the trend of environmental noise) may be used to determine a filtering scheme.

In embodiments, the noise state can be based on a single measurement from a single sensor and/or measurements from a plurality of sensors. In other words, the noise state may depend on a measured noise level from a single sensor or a measured noise level from a plurality of sensors. Additionally or alternatively, the noise state may be based on a series of measurements over an interval of time. The interval of time may be any suitable amount of time. For example, the interval of time may be one millisecond to several minutes. By way of example, where a plurality of measurements are taken, the noise levels can be combined using a standard mean average, thereby creating a single measurement for the plurality of sensors and/or the interval of time. It is also contemplated that these measurements may be taken simultaneously, sequentially, and/or in alternating bursts. Any and all aspects or combinations thereof are contemplated herein.

As mentioned, the environmental noise may be measured by one or more sensors associated with the furniture item 4102. In one aspect, the one or more sensors may be the same capacitance sensors used in one or more sensing features discussed above. In further aspects, the one or more sensors are distinct from the capacitance sensors used in the one or more sensing features discussed above. In either case, the one or more sensors are communicatively coupled to one or more processors associated with the furniture item 4102. In turn, the one or more processors may receive the measured value from the one or more sensors so as to generate a baseline noise level.

In one embodiment, a priming sequence and/or a triggering event are used to determine an initial noise state and/or initial baseline noise level. By way of example, an initial baseline may be set (or reset) based on a triggering event. The triggering event may include detecting a startup or a reset, detecting power up/down operation, receiving a request by an operator via a recalibration instruction (e.g., detecting that a button has been depressed for a predetermined amount of time), and the like. For instance, a power up/down operation may be detected if power to the furniture item 4102 has been turned on/off or if the furniture item 4102 has been engaged/disengaged from a power source, such as an electrical outlet. In one aspect, the initial noise state for the furniture item 4102 may be determined when components associated with the furniture item 4102 (e.g., motor) are powered down such that the power to these components does not interfere with measuring the environmental noise. Accordingly, based on detecting a priming sequence and/or a triggering event, embodiments may be "primed" as this initial measurement of the environmental noise can then be used to determine an initial noise state and/or an initial baseline noise level.

In one embodiment, the baseline noise level (initial or otherwise) can be continuously and/or automatically adjusted. This too may occur based upon certain triggering events, such as the expiration of a certain amount of time, detecting a lack of presence and/or occupancy, and the like. Updating the baseline noise level may promote the continuous calibration of the furniture item 4102 because the environment of the furniture may constantly change, resulting in changes to the environmental noise. This in turn can improve the overall safety or benefit of one or more sensing features of the furniture item 4102. For example, a more accurate baseline noise level can allow embodiments to more accurately detect presence so as to stop further articulation or movement of the furniture item 4102. It should be appreciated that there may be circumstance in which the baseline noise level is not adjusted and remains fixed in response to certain triggering events, as discussed below.

In embodiments, the baseline noise level may be used in determining a threshold. As described above, the threshold can be associated with one or more sensing features of the furniture item 4102 such as an indication of presence and/or an indication of occupancy. As shown in FIG. 41, the baseline noise level 4130 is utilized in determining the threshold 4150. For instance, a predetermined delta value may be applied to the baseline noise level 4130 to determine the threshold 4150. Additionally or alternatively, the threshold 4150 can be determined based on a predetermined algorithm that relies on the baseline noise level 4130. It should be appreciated that the predetermined algorithm for the threshold can be based other factors beyond the baseline noise level, such as the range of motion profile.

Still referring to FIGS. 41-42, the threshold 4150 may be updated in response to any changes to the baseline noise level 4130 according to aspects herein. As shown, the threshold may be adjusted (e.g., increased or decreased) from a first threshold 4150 to a second threshold 4212 based on changes to the baseline noise level. Hence, when a first baseline noise level 4130 is updated to a second baseline noise level 4240, the first threshold 4150 can be adjusted to the second threshold 4212.

In embodiments, the threshold and/or the baseline noise level may be fixed based on a sensor trigger level being exceeded. For instance, the baseline noise level may remain fixed upon detecting that the sensor trigger level is exceeded, which may occur if there is an indication of presence and/or occupancy of the furniture item 4102. In other words, if a capacitance measurement of one or more sensors exceeds the sensor trigger level, the baseline noise level may be fixed so as to preserve the accuracy of the one or more sensing features.

Figure 43:
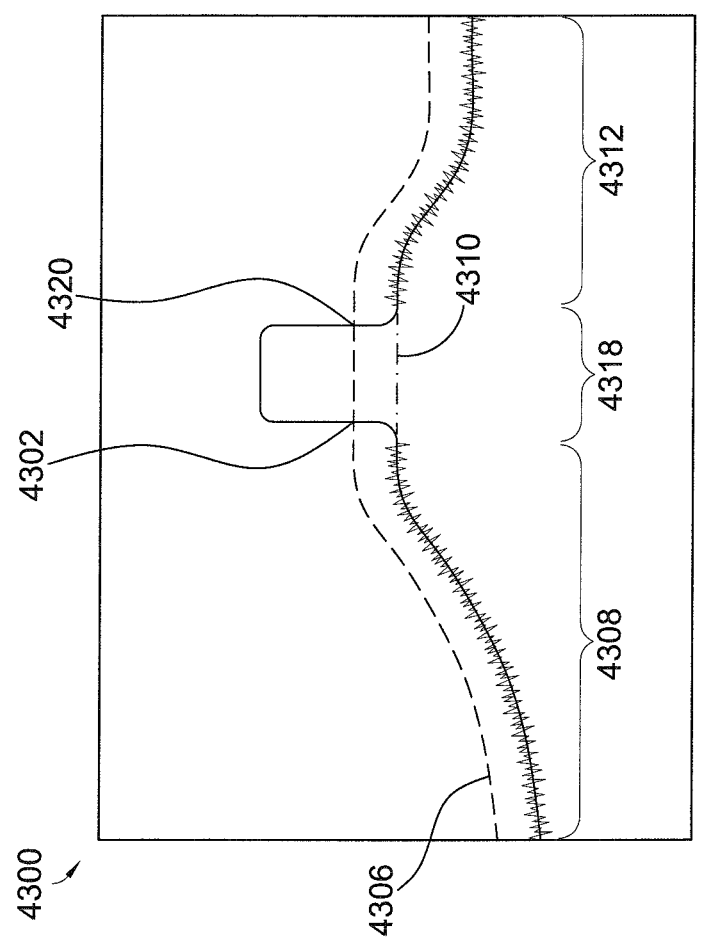
FIG. 43 is an exemplary graphical depiction of environmental noise for a furniture item, in accordance with embodiments of the invention.

Continuing with this example, and referring now to FIG. 43, an exemplary graphical depiction 4300 of environmental noise for a furniture item is depicted in accordance with embodiments of the invention. As shown, the baseline noise level 4310 may be continuously updated to account for an increase in environmental noise during a first period of time 4308. During a second period of time 4318 (e.g., when there is an indication of presence and/or occupancy), the one or more sensors may measure an increased level of voltage and/or capacitance such that it exceeds a sensor trigger level 4306. In response to the sensor trigger level 4306 being exceeded, the baseline noise level 4310 may remain fixed. During a third period of time 4312, embodiments may determine that the triggering event has ceased by determining that the sensor level has fallen below the sensor trigger level 4306, as depicted by element 4320. At some point after the triggering event has ceased, such as during the third period of time 4312, the baseline noise level may no longer be fixed and, in turn, be adjusted to account for any changes in environmental noise.

In one embodiment, there is a delayed adjustment of the baseline noise level. This delayed adjustment may occur at some point after the triggering event has ceased (e.g., when the measured capacitance falls below the sensor trigger level as shown by element 4320). This delayed adjustment of the baseline noise level may be any suitable time period. By way of example, the delay time period may range from one millisecond to several minutes. It should be appreciated that delaying the adjustment of the baseline noise level may preserve the overall sensitivity and ability to detect presence and/or occupancy.

Returning to FIG. 41, the sensor trigger level 4160 may also be determined based on the baseline level 4130 and/or the threshold 4150. Any and all suitable algorithms may be used for determining the sensor trigger level 4160. For example, the sensor trigger level may be determined by applying an offset value (or delta) to the baseline noise level 4130 and/or the threshold 4150. As illustrated in FIG. 41, the sensor trigger level 4160 may represent a sensor measurement that is halfway between the baseline noise level 4130 and the threshold level 4150. As such, if the capacitance measurement of one or more of the sensors associated with the furniture item 4102 exceeds the sensor trigger level 4160 but does not exceed the threshold 4150, the baseline noise level 4130 may remain fixed and unadjusted. While the sensor trigger level is depicted as being lower than the threshold 4150, it is contemplated that the sensor trigger level 4160 may be the same as the threshold 4150.

As mentioned, adjusting the baseline noise level may be delayed. Still referring to FIG. 41, the adjustment of the baseline noise may be delayed for a period of time after the sensor value falls below either the sensor trigger level 4160 and/or the threshold level 4150. Though depicted as being offset from each other, it is contemplated that the sensor trigger level 4160 and the threshold level 4150 may be the same. In one embodiment, this period of time can be reset if the sensor level again exceeds the threshold level 4150 and/or sensor trigger level 4160 before the delay time period expires.

In embodiments, the baseline noise level is determined based on applying one or more filtering schemes to the measured environmental noise. As shown in FIG. 41, the measured noise 4120 may fluctuate rapidly as sensors are able detect the slightest changes in noise levels. Accordingly, embodiments may apply one or more filtering schemes to generate a baseline noise level. In one aspect, the baseline noise level can be based on applying the one or more filtering schemes to the noise state. As described above, the noise state may be a single measurement and/or measurements from a plurality of sensors. Additionally or alternatively, the noise state may be based measurements at one moment in time or a series of measurements over time. Any and all aspects or combinations thereof are contemplated herein.

The one or more filtering schemes may include any suitable filtering schemes, including impulse and non-impulse filters. Additionally and alternatively, infinite impulse response filters and/or finite impulse response filters may be used. Infinite impulse response filters are distinguishable from finite impulse response filters as they involve feedback from one or more previous calculations. That is, whereas finite impulse response filters may not rely on any previous calculations, the infinite impulse response filter may include one or more previous calculations as input for calculating a second output. In addition, finite impulse response filters may provide a quicker and more efficient means of filtering, conserving computational power and resources. Exemplary infinite impulse response filters include a Butterworth filter, an exponential moving average filter (also known as an exponentially weighted moving average filter), a first and/or a second order Chebyshev filter, an elliptic filter, a Bessel filter, and the like. Any and all filtering schemes may be used to generate a baseline noise level.

In one embodiment, the filtering scheme is determined based on the previous baseline state. It should be appreciated that while a first filtering scheme may be used to generate a first baseline noise state, to update the first baseline noise state, a second filtering scheme may be determined based on the trend of environmental noise (e.g., whether the environmental noise increases or decreases with respect to the previous baseline noise state). The trend of environmental noise may be determined in suitable manner. For instance, the trend of environmental noise may be based on a comparison between the first baseline noise state and the second baseline noise state. Additionally or alternatively, one or more measurements in the first baseline noise state may be compared with one or more measurements from a second baseline noise state. Any and all aspects or combinations thereof are contemplated herein.

In one embodiment, the second filtering scheme can be determined based on the trend of environmental noise. For instance, if the environmental noise level is increasing such that there is an increasing trend of environmental noise, a baseline rise filtering scheme may be determined. Similarly, if the environmental noise level is decreasing such that there is a decreasing trend of environmental noise, a baseline fall filtering scheme may be determined. In aspects, the second filtering scheme may be an exponentially weighted moving average, which can be determined based on the following formula:

$$EMA_{new} = (1-\alpha)(EMA_{old}) + \alpha * \text{measurement}$$

Continuing with this example, the second filtering scheme may be determined and/or altered based on varying the weight, $\alpha$ (also called alpha). Depending on whether the measured noise from the one or more sensors has increased or decreased over time (e.g., positive or negative trend in environment noise), different weights can be utilized. For example, a baseline rise weight may be used if there is an increasing trend in the environmental noise. Additionally or alternatively, a baseline fall weight may be used if there is a decreasing trend in the environmental noise. It should be appreciated that by determining the second filtering scheme based on the environmental noise level trend, it allows for determining an appropriate filtering scheme that allows for quicker response times if there is an increasing noise level trend and preventing sudden signal drops when there is a decreasing noise level trend. This may increase the overall safety and sensing capabilities of the furniture item 4102. In yet a further aspect, the weight can depend on how much or how little the environmental noise has increased and/or decreased with respect to the previous noise levels.

In one embodiment, the filtering schemes can be determined based on a sensor trigger level. As mentioned above, the sensor trigger level may be determined based on the baseline noise level. If a triggering event occurs, the filtering scheme may be adjusted such that the baseline noise level remains fixed despite any increase and/or decrease in the environmental noise. Continuing with the exemplary embodiment above, the weight, $\alpha$, can be set to zero when the sensor trigger level is exceeded. As such, the second baseline noise level will be the same as the first baseline noise level regardless of any changes in measured noise levels. This may occur until the triggering event is no longer true and/or until a certain amount of time has elapsed since the triggering event has ended.

Additionally or alternatively, embodiments may generate a baseline noise level for the furniture item 4102 based on a layered filter scheme. For example, in one aspect, an output to a first filtering scheme may be used as input to a second filtering scheme. In other words, a first filtering scheme may be applied to filter the environmental noise, producing a first filtered noise output. In turn, the first filtered noise output can be used as input to a second filtering scheme to generate a second baseline noise level. In one embodiment, the first filtering scheme may be a second order Chebyshev filter while the second filtering scheme may be an exponentially weighted moving average filter. By using layered filtering schemes, it may enhance the sensing features associated with the furniture item 4102, including generating a baseline noise level that is more responsive to changes to the environmental noise.

In various embodiments, the first filtering scheme can be fixed while the second filtering scheme can be calibrated based on the environmental noise. For instance, the first filtering scheme may be fixed by predetermining coefficients of the first filtering scheme such that they are not adjusted based on the environmental noise. Alternatively, the second filtering scheme may be calibrated based on the environmental noise. In other words, coefficients of the second filtering scheme may be adjusted to account for a plurality of conditions of the furniture item as described herein, including an increase in the environmental noise, a decrease in the environmental noise, no change in environmental noise, a previous noise state, and the like. It should be appreciated that the filtering schemes may be layered by utilizing one mathematical calculation and/or separate mathematical calculations. In certain embodiments, layering the first filtering scheme and the second filtering scheme is performed in separate mathematical calculations, which may ease the fine tuning of the system to account for the environmental noise (either manually or automatically).

From the foregoing, it will be seen that this invention is one well adapted to attain all the ends and objects hereinabove set forth together with other advantages, which are obvious and which are inherent to the structure. It will be understood that certain features and subcombinations are of utility and may be employed without reference to other features and subcombinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The invention claimed is:

1. A non-transitory computer-readable storage medium including instructions that, when executed by a processor, cause the processor to:
    determine a first noise state associated with an environment of the furniture item based on a first measured noise received from one or more sensors associated with the furniture item;
    generate a first baseline noise level for the furniture item based on filtering the first noise state associated with the environment of the furniture item;

determine a second noise state associated with the environment of the furniture item based on a second measured noise received from the one or more sensors associated with the furniture item;

generate a second baseline noise level for the furniture item based on filtering the second noise state associated with the environment of the furniture item; and adjust the first baseline noise level to the second baseline noise level.

2. The storage medium of claim 1, the instructions further comprising determine a threshold for a sensing feature for the furniture item based on at least one of the first baseline noise level and the second baseline noise level.

3. The storage medium of claim 2, wherein the sensing feature for the furniture item is at least one of an indication of presence and an indication of occupancy.

4. The storage medium of claim 1, the instructions further comprising determine a filtering scheme to filter the second noise state, wherein the filtering scheme is determined based on the trend of environmental noise of the furniture item.

5. The storage medium of claim 4, wherein the filtering scheme to filter the second noise state is determined based on detecting a triggering event.

6. The storage medium of claim 1, wherein at least one of the first noise state and the second noise state is filtered using one or more infinite impulse response filters.

7. The storage medium of claim 6, wherein the first baseline noise level and the second baseline noise level is generated by layering two different infinite impulse response filters.

8. The storage medium of claim 1, wherein the first baseline noise level is adjusted to the second baseline noise level based on a determination that the second noise state is below a sensor trigger level.

9. A method for calibrating detection features associated with a furniture item comprising:

determining a first noise state associated with an environment of the furniture item based a first measured noise received from one or more sensors associated with the furniture item;

generating a first baseline noise level for the furniture item based on filtering the first noise state associated with the environment of the furniture item;

determining a second noise state associated with the environment of the furniture item based on a second measured noise received from the one or more sensors associated with the furniture item;

generating a second baseline noise level for the furniture item based on filtering the second noise state associated with the environment of the furniture item; and adjusting the first baseline noise level to the second baseline noise level.

10. The method of claim 9, the method further comprising determining a threshold for a sensing feature for the furniture item based on at least one of the first baseline noise level and the second baseline noise level.

11. The method of claim 9, the method further comprising determining a filtering scheme to filter the second noise state, wherein the filtering scheme is determined based on a trend of the environmental noise of the furniture item.

12. The method of claim 11, wherein the filtering scheme to filter the second noise state is determined based on detecting a triggering event.

13. The method of claim 9, wherein at least one of the first noise state and the second noise state is filtered using one or more infinite impulse response filters.

14. The method of claim 13, wherein the first baseline noise level and the second baseline noise level is generated by layering two different infinite impulse response filters.

15. The method of claim 9, wherein adjusting the first baseline noise level to the second baseline noise level is based determining that the second noise state is below a sensor trigger level.

16. A system for calibrating detection features for a furniture item comprising:

one or more processors;

computer storage memory having computer-executable instructions stored thereon which, when executed by the one or more processors, perform operations comprising:

determine a first noise state associated with an environment of the furniture item based on a first measured noise received from one or more sensors associated with the furniture item;

generate a first baseline noise level for the furniture item based on filtering the first noise state of the environment of the furniture item via a first filtering scheme;

generate a first threshold for a sensing feature based on the first baseline noise level;

determine a second noise state associated with the environment of the furniture item based a second measured noise received from the one or more sensors associated with the furniture item;

generate a second baseline noise level based on filtering the second noise state associated with the environment of the furniture item via a second filtering scheme;

adjust the first baseline noise level to the second baseline noise level; and generate a second threshold for the sensing feature based on the second baseline noise level.

17. The system of claim 16, wherein adjusting the first baseline noise level to the second baseline noise level is based on a determination that the second noise state is below a sensor trigger level.

18. The system of claim 17, wherein the second filtering scheme is a layered filtering scheme using a Chebyshev filter and an exponentially weighted moving average filter.

19. The system of claim 18, wherein a weight for the exponentially weighted moving average filter is determined based on a trend of the environmental noise of the furniture item.

20. The system of claim 19, wherein the first baseline noise level is an initial baseline noise level that is determined based on a triggering event.

* * * * *